US008137046B2

(12) United States Patent
Kishimoto et al.

(10) Patent No.: US 8,137,046 B2
(45) Date of Patent: Mar. 20, 2012

(54) SUBSTRATE TRANSFER APPARATUS AND SUBSTRATE TRANSFER METHOD

(75) Inventors: Katsushi Kishimoto, Osaka (JP); Yusuke Fukuoka, Osaka (JP); Noriyoshi Kohama, Osaka (JP); Yusuke Ozaki, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 357 days.

(21) Appl. No.: 12/536,912

(22) Filed: Aug. 6, 2009

(65) Prior Publication Data

US 2010/0034624 A1 Feb. 11, 2010

(51) Int. Cl.
*B65G 35/00* (2006.01)

(52) U.S. Cl. ............ 414/676; 414/226.01; 406/88

(58) Field of Classification Search .......... 406/76, 406/88, 89; 414/676, 226.01
See application file for complete search history.

(56) References Cited

U.S. PATENT DOCUMENTS

| 3,052,339 | A | * | 9/1962 | Carter | 198/460.1 |
| 3,375,093 | A | * | 3/1968 | Reising | 65/25.4 |
| 3,399,042 | A | * | 8/1968 | McMaster et al. | 65/25.4 |
| 3,473,910 | A | * | 10/1969 | Wilde et al. | 65/182.2 |
| 3,822,777 | A | * | 7/1974 | Jepsen | 198/370.07 |
| 4,387,890 | A | * | 6/1983 | Lampe | 271/225 |
| 4,984,960 | A | * | 1/1991 | Szarka | 198/750.12 |
| 5,868,549 | A | * | 2/1999 | Lee et al. | 414/791.6 |
| 6,336,775 | B1 | * | 1/2002 | Morita et al. | 406/88 |
| 6,515,736 | B1 | * | 2/2003 | Hayden et al. | 355/75 |
| 7,284,945 | B2 | * | 10/2007 | Ikehata et al. | 414/676 |
| 7,428,959 | B2 | * | 9/2008 | Jung et al. | 198/493 |
| 7,905,195 | B2 | * | 3/2011 | Yamasaki et al. | 118/300 |
| 7,908,995 | B2 | * | 3/2011 | Inamasu et al. | 118/300 |

FOREIGN PATENT DOCUMENTS

| JP | 61-178725 | 11/1986 |
| JP | 7-228342 | 8/1995 |
| JP | 2001-239144 | 9/2001 |
| WO | WO 2005/074020 | 8/2005 |

OTHER PUBLICATIONS

U.S. Appl. No. 12/535,230, filed Aug. 4, 2009, entitled "Substrate Transfer Apparatus".

* cited by examiner

*Primary Examiner* — Joseph A Dillon, Jr.
(74) *Attorney, Agent, or Firm* — Nixon & Vanderhye, P.C.

(57) ABSTRACT

A substrate transfer apparatus comprising: a plurality of floating-transfer guide plates adjacent to each other, each of guide plates having a plurality of floating gas ejecting holes; a gas supplying source; a tray to mount a substrate to be transferred, and that is floated by the floating gas; and a transfer arm for transferring the floated tray from the guide plate to the adjacent other guide plate, wherein the tray includes both side edges, and a contact/engagement portion formed at the respective both side edges for the transfer arm, each of the transfer arms including a base portion that can horizontally reciprocate along a rail provided so as to be parallel to the transfer direction, a guide portion provided to the base portion, that can horizontally reciprocate in a direction orthogonal to the transfer direction, and an arm portion provided to the guide portion, that can horizontally reciprocate in the direction parallel to the transfer direction.

9 Claims, 11 Drawing Sheets

SUBSTRATE TRANSFER APPARATUS AND SUBSTRATE TRANSFER METHOD

CROSS-REFERENCE TO RELATED APPLICATIONS

This application is related to Japanese application No. 2008-204210 filed on Aug. 7, 2008, whose priority is claimed under 35 USC §119, the disclosure of which is incorporated by reference in its entirety.

BACKGROUND OF THE INVENTION

1. Field of the Invention

The present invention relates to a substrate transfer apparatus and a substrate transfer method, and more particularly to a substrate transfer apparatus that transfers a substrate in order to perform, for example, a plasma process onto a surface of the substrate, which is a plate-like subject to be processed having a flat plate shape, and a substrate transfer method for transferring a substrate by using the substrate transfer apparatus.

2. Description of the Related Art

When a semiconductor thin film is formed on a surface of a substrate that is a subject to be processed having a flat plate shape, a plasma processing apparatus employing a plurality of vacuum chambers has widely been used. In the plasma processing apparatus described above, at least one of the plurality of vacuum chambers is generally specified as the vacuum chamber for a plasma process for performing the plasma process onto the surface of the substrate. Further, the plasma processing apparatus generally includes a transfer apparatus for transferring the substrate among the plurality of vacuum chambers.

As the transfer apparatus, there has been known an apparatus of a floating-type transfer system. In the apparatus of the floating-type transfer system, a guide plate for mounting a substrate is provided to each of vacuum chambers, and the substrate is mounted on the guide plate. Then, the substrate is floated from the guide plate by means of a floating gas in the vacuum chamber. The floated substrate is transferred to the adjacent vacuum chamber along the guide plate.

Specifically, the substrate transfer apparatus of the floating-type transfer system includes a floating-transfer guide plate provided at each vacuum chamber and provided with a plurality of floating-gas ejecting holes, and a gas supplying source for supplying the floating gas to the respective guide plates. Since the floating gas is ejected from the gas ejecting holes of the guide plate, the substrate is floated from the guide plate, and then, the floated substrate is transferred along the guide plate among the plurality of vacuum chambers due to external force.

Apparatuses disclosed in Japanese Unexamined Utility Model Publication No. 61-178725 and Japanese Unexamined Patent Publication No. 7-228342 have been also known, for example, as the substrate transfer apparatus utilizing the transfer system described above.

The substrate transfer apparatus of the floating transfer system described above includes, for example, a horizontally extending transfer arm that can move up and down for transferring a rectangular substrate among a plurality of vacuum chambers, and a transfer drive unit for transferring/moving up/down the transfer arm in a transfer direction and in a vertical direction.

However, there arise problems described below in the substrate transfer apparatus, of the substrate transfer apparatuses having the transfer arm and the transfer drive unit, in which the substrate is not directly mounted on the guide plate, but the substrate is mounted through a tray placed on the guide plate in order to protect the surface of the substrate.

The tray has to be formed to have an area larger than the area of the substrate to be mounted thereon. In order to achieve this, the tray generally has a rectangular planar shape, and a portion close to a side edge and a portion close to an end edge are formed to project, whereby the length of the long side and the length of the short side are larger than those of the substrate. The reason is because it is necessary to form a plurality of fitting holes along the transfer direction, with which a suspending leading portion of the transfer arm is releasably fitted by an ascending/descending movement, at the portions close to the side edge of the tray on which the substrate is mounted.

When the tray and the transfer arm are configured as described above, it is not so easy to achieve positioning of the fitting holes on the tray and the leading portion of the transfer arm upon the fitting, unless the tray is correctly placed on a predetermined portion with respect to the guide plate. This provides non-smooth fitting, which entails a trouble related to the transfer.

When the tray and the transfer arm are configured as described above, and further, the guide plate has incorporated therein a heater for heating the substrate, wherein the heater is formed to have the width almost the same as that of the substrate, the problem described below arises. Specifically, because the portion close to the side edge of the tray projects from the side edge of the guide plate, the difference in a temperature distribution occurs between a portion of the tray facing the heater and a portion of the tray projecting from the heater, when the substrate is heated by the heater. Due to the difference in the temperature distribution, the tray might be curved upwardly at the portion close to the side edge, with the result that a film-forming process for manufacturing a semiconductor thin film onto the surface of the substrate is not satisfactorily performed, or the trouble related to the transfer might occur.

SUMMARY OF THE INVENTION

The present invention is accomplished in view of the foregoing circumstances, and aims to provide a substrate transfer apparatus and a substrate transfer method that can prevent the possibility of the trouble related to the transfer.

According to one aspect of the present invention, there is provided that a substrate transfer apparatus comprising:

a plurality of floating-transfer guide plates adjacent to each other with a space, each of guide plates having a plurality of floating gas ejecting holes;

a gas supplying source for supplying a floating gas to the guide plates;

a tray that is placed on one of the guide plates in order to mount a substrate to be transferred, and that is floated by the floating gas; and a transfer arm for transferring the floated tray from the guide plate to the adjacent other guide plate, wherein the tray includes both side edges parallel to a transfer direction of the substrate, and a contact/engagement portion formed at the respective both side edges for the transfer arm, and the transfer arm is provided as a pair so as to be located at the respective sides of the tray placed onto the guide plate, each of the transfer arms including a base portion that can horizontally reciprocate along a rail provided so as to be parallel to the transfer direction, a guide portion provided to the base portion, that can horizontally reciprocate in a direction orthogonal to the transfer direction, and an arm portion provided to the guide portion, that can horizontally reciprocate in the direction parallel to the transfer direction, and that has an inward projecting end, which is a free end, wherein the inward projecting end of the transfer arm contacts and engages, from an outer side to an inner side of the arm, with the contact/engagement portion at the side edge of the tray, or disengaged therefrom from the inner side to the outer side, due to the horizontal reciprocating movement of the guide portion.

DETAILED DESCRIPTION OF THE PREFERRED EMBODIMENTS

Figure 1:
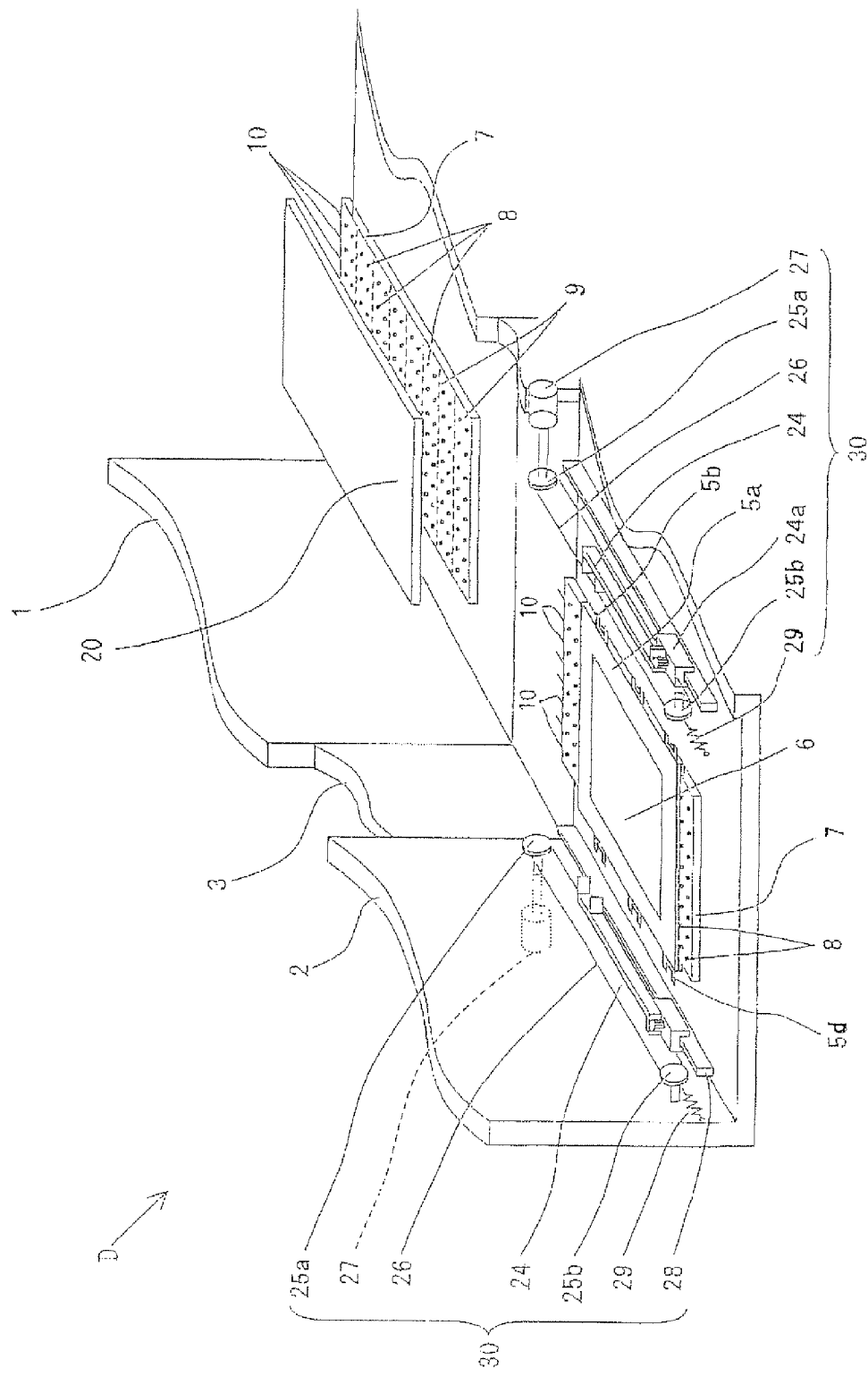
FIG. 1 is a partially cutout perspective view showing a substrate transfer apparatus, which is incorporated in a plasma processing apparatus, according to a first embodiment of the present invention.

The plurality of floating-transfer guide plates in the substrate transfer apparatus is arranged so as to be spaced from each other. Examples of the guide plates include the one provided with the plurality of floating-gas ejecting holes, and used to transfer a floated plate-like subject to be processed—the tray placed on the guide plate and a plasma-processing substrate mounted on the tray—by external force. There is no limitation on the shape and material thereof.

Each of the guide plates is made of, for example, a rectangular plate member having a floating-gas supplying tube connected to an external gas supplying source. The guide plates are arranged on one line along the transfer direction in a plurality of processing chambers adjacent to each other via a gate valve. A floating gas is supplied to each of the guide plates from the gas supplying source. Any gases can be used as the floating gas, so long as they do not give damages to the guide plates and the subject to be processed. Preferable examples of the floating gas include nitrogen gas, helium gas, argon gas, etc.

The plurality of (e.g., 100 to 200) floating-gas ejecting holes (e.g., circular holes each having a diameter of 0.5 to 5.0 mm) on the respective guide plates can be composed of, for example, a plurality of independent ejecting hole groups (e.g., 5 to 10 groups). The ejecting hole groups are formed transversely in the transfer direction and formed with a predetermined space in the transfer direction.

There is no limitation on the shape and material of the tray on which the substrate is to be mounted, so long as it can be mounted on the guide plate as having the substrate mounted thereon, and can endure the temperature and pressure in various processes. It is preferable that the tray is light in weight from the viewpoint of being floated by the floating gas. For example, the tray may be made of a thin plate (having a thickness of 0.5 mm to 2.0 mm, for example) of stainless steel or an aluminum alloy.

The transfer arm is for transferring the floated tray to the adjacent other guide plate from the guide plate.

The tray has the both side edges. These side edges are parallel to the transfer direction. The contact/engagement portion is provided at each of the both side edges. The contact/engagement portion is in contact with and engaged with the transfer arm when the tray is transferred by the transfer arm.

A pair of the transfer arms is provided so as to be located at both sides of the tray placed onto the guide plate. Each of the transfer arm has a base portion, a guide portion, and an arm portion. The base portion can horizontally reciprocate along a rail provided parallel to the transfer direction. The guide portion is provided to the base portion, that can horizontally reciprocate in a direction orthogonal to the transfer direction. The arm portion is provided to the guide portion, that can horizontally reciprocate in the direction parallel to the transfer direction. The inward projecting end, which is the free end of the arm portion, contacts and engages from an outer side to an inner side of the arm, with a contact/engagement portion at the side edge of the tray, or disengaged therefrom from the inner side to the outer side, due to the horizontal reciprocating movement of the guide portion.

A mechanism including a pair of pulleys spaced in the transfer direction, a wire looped around the pulleys, and a motor connected to one of the pulleys is, for example, used in order to drive the transfer arm.

According to another aspect of the present invention, there is provided that a substrate transfer apparatus comprising:

a plurality of floating-transfer guide plates adjacent to each other with a space, each of guide plates having a plurality of floating gas ejecting holes;

a gas supplying source for supplying a floating gas to the guide plates;

a tray that is placed on one of the guide plates in order to mount a substrate to be transferred, and that is floated by the floating gas; and a transfer member for transferring the floated tray from the guide plate to the adjacent other guide plate, wherein the tray includes a main body portion having both side edges and a plurality of pairs of projecting portions formed so as to partially project outwardly from both side edges of the main body portion, and the transfer member is provided as a pair so as to be located at the respective sides of the tray placed onto the guide plate, each of the transfer members including an endless track belt formed around a vertical rotational axis so as to be rotatable, and a plurality of protrusions that are formed on the surface of the belt so as to project horizontally, and are in contact with and engaged with or disengaged from the projecting portions at the tray with the rotation of the belt.

The configurations of the floating-transfer guide plate and the gas supplying source in a substrate transfer apparatus according to another aspect of the present invention are the same as those in the substrate transfer apparatus according to one aspect of the present invention.

The substrate transfer apparatus according to another aspect of the present invention further includes a tray that is placed onto the guide plate in order to mount a substrate to be transferred, and that is floated by a floating gas, and a transfer member for transferring the floated tray from the guide plate to the adjacent other guide plate.

The tray includes a main body portion and a projecting portion. The main body portion has both side edges. The tray has a plurality of pairs of the projecting portions. Each of the projecting portions is formed so as to partially project outwardly from the both side edges of the main body portion. A pair of the transfer members is provided so as to be located at both sides of the tray placed onto the guide plate. Each of the transfer members includes an endless track belt and a plurality of protrusions. The endless track belt is formed around a vertical rotational axis so as to be rotatable. The plurality of protrusions are formed on the surface of the belt so as to horizontally project, and they are in contact with and engaged with the projecting portions of the tray or disengaged therefrom with the rotation of the belt.

According to still another aspect of the present invention, there is provided that a substrate transfer method by using a substrate transfer apparatus comprising: a plurality of floating-transfer guide plates adjacent to each other with a space, each of guide plates having a plurality of floating gas ejecting holes; a gas supplying source for supplying a floating gas to the guide plates; a tray that is placed on one of the guide plates in order to mount a substrate to be transferred, and that is floated by the floating gas; and a transfer arm for transferring the floated tray from the guide plate to the adjacent other guide plate, wherein the tray includes both side edges parallel to a transfer direction of the substrate, and a contact/engagement portion formed at the respective both side edges for the transfer arm, and the transfer arm is provided as a pair so as to be located at the respective sides of the tray placed onto the guide plate, each of the transfer arms including a base portion that can horizontally reciprocate along a rail provided so as to be parallel to the transfer direction, a guide portion provided to the base portion, that can horizontally reciprocate in a direction orthogonal to the transfer direction, and an arm portion provided to the guide portion, that can horizontally reciprocate in the direction parallel to the transfer direction, and that has an inward projecting end, which is a free end, wherein the inward projecting end of the transfer arm contacts and engages, from an outer side to an inner side of the arm, with a contact/engagement portion at the side edge of the tray, or disengaged therefrom from the inner side to the outer side, due to the horizontal reciprocating movement of the guide portion, wherein the tray is transferred in a state in which the inward projecting ends at the arm portions of a pair of the transfer arms are in contact with and engaged with the contact/engagement portion at the tray so as to hold same.

A substrate transfer method according to yet another aspect of the present invention employs the substrate transfer apparatus according to one aspect of the present invention. The substrate transfer method has a feature in that the inward projecting end at the arm portion of each of the pair of the transfer arms in the substrate transfer apparatus is in contact and engaged with the contact/engagement portion of the tray so as to hold the same, whereby the tray is transferred.

According to yet another aspect of the present invention, there is provided that a substrate transfer method by using a substrate transfer apparatus comprising: a plurality of floating-transfer guide plates adjacent to each other with a space, each of guide plates having a plurality of floating gas ejecting holes; a gas supplying source for supplying a floating gas to the guide plates; a tray that is placed on one of the guide plates in order to mount a substrate to be transferred, and that is floated by the floating gas; and a transfer member for transferring the floated tray from the guide plate to the adjacent other guide plate, wherein the tray includes a main body portion having both side edges and a plurality of pairs of projecting portions formed so as to partially project outwardly from both side edges of the main body portion, and the transfer member is provided as a pair so as to be located at the respective sides of the tray placed onto the guide plate, each of the transfer members including an endless track belt formed around a vertical rotational axis so as to be rotatable, and a plurality of protrusions that are formed on the surface of the belt so as to project horizontally, and are in contact with and engaged with or disengaged from the projecting portions at the tray with the rotation of the belt, wherein the tray is transferred in a state in which the protrusions of a pair of the transfer members are in contact with and engaged with the projecting portions of the tray.

A substrate transfer method according to yet another aspect of the present invention employs the substrate transfer apparatus according to one aspect of the present invention. The substrate transfer method has a feature in that the protrusions at the pair of the transfer members in the substrate transfer apparatus are in contact and engaged with the projecting portions of the tray, and with this state, the tray is transferred.

According to one aspect of the present invention, a substrate transfer apparatus comprises:

a plurality of floating-transfer guide plates adjacent to each other with a space, each of guide plates having a plurality of floating gas ejecting holes;

a gas supplying source for supplying a floating gas to the guide plates;

a tray that is placed on one of the guide plates in order to mount a substrate to be transferred, and that is floated by the floating gas; and a transfer arm for transferring the floated tray from the guide plate to the adjacent other guide plate.

The tray includes both side edges parallel to a transfer direction, and a contact/engagement portion formed at the respective both side edges for the transfer arm, and the transfer arm is provided as a pair so as to be located at the respective sides of the tray placed onto the guide plate, each of the transfer arms including a base portion that can horizontally reciprocate along a rail provided so as to be parallel to the transfer direction, a guide portion provided to the base portion, that can horizontally reciprocate in a direction orthogonal to the transfer direction, and an arm portion provided to the guide portion, that can provided horizontally at the guide portion in the direction parallel to the transfer direction, and that has an inward projecting end, which is a free end, wherein the inward projecting end of the transfer arm contacts and engages, from an outer side to an inner side of the arm, with a contact/engagement portion at the side edge of the tray, or disengaged therefrom from the inner side to the outer side, due to the horizontal reciprocating movement of the guide portion.

Accordingly, in the substrate transfer apparatus described above, the inward projecting end at the arm portion of the transfer arm is in contact with and engaged with the contact/engagement portion of the tray from the outer side toward the inner side due to the horizontal reciprocating movement of the guide portion. Therefore, the tray can be transferred as floated with the arm portion of the transfer arm being engaged with the contact/engagement portion of the tray without the need of the engagement between the fitting holes of the tray and the leading end portion of the transfer arm as in the conventional substrate transfer apparatus. Consequently, the possibility of the trouble related to the transfer as in the conventional case can be prevented.

The substrate transfer apparatus according to another aspect of the present invention includes the guide plate, the gas supplying source, and the tray, those of which are similar to those in the substrate transfer apparatus according to one aspect of the present invention, and a transfer member for transferring the floated tray to the adjacent other guide plate from the guide plate. The tray has the main body portion having both side edges, and a plurality of pairs of the projecting portions formed so as to partially project outwardly from the respective both side edges at the main body portion. A pair of the transfer members is provided so as to be located at both sides of the tray placed onto the guide plate. Each of the transfer members includes an endless track belt formed around a vertical rotational axis so as to be rotatable, and a plurality of protrusions. The plurality of protrusions are formed on the surface of the belt so as to horizontally project, and they are in contact with and engaged with the projecting portions of the tray or disengaged therefrom with the rotation of the belt.

According to the substrate transfer apparatus described above, the plurality of protrusions at the endless track belt at each of the transfer members are in contact with and engaged with the plurality of pairs of the projecting portions at the tray with the rotation of the belt. Therefore, the tray can be transferred as floated with the plurality of protrusions at the respective belts being engaged with the plurality of pairs of the projecting portions at the tray without the need of the engagement between the fitting holes of the tray and the leading end portion of the transfer arm as in the conventional substrate transfer apparatus. Consequently, the possibility of the trouble related to the transfer as in the conventional case can be prevented.

A substrate transfer method according to still another aspect of the present invention employs the substrate transfer apparatus according to one aspect of the present invention, wherein the inward projecting end at the arm portion of each of the pair of the transfer arms in the substrate transfer apparatus is in contact with and engaged with the contact/engagement portion of the tray so as to hold the same, whereby the tray is transferred.

Therefore, according to the substrate transfer method described above, the tray can be transferred as floated with the arm portion of the transfer arm being engaged with the contact/engagement portion of the tray without the need of the engagement between the fitting holes of the tray and the leading end portion of the transfer arm as in the conventional substrate transfer apparatus. Consequently, the possibility of the trouble related to the transfer as in the conventional case can be prevented.

A substrate transfer method according to yet another aspect of the present invention employs the substrate transfer apparatus according to one aspect of the present invention, wherein the protrusions of the pair of the transfer members in the substrate transfer apparatus are in contact with and engaged with the projecting portions of the tray, and with this state, the tray is transferred.

Therefore, according to the substrate transfer method described above, the tray can be transferred as floated with the protrusions of the transfer member being engaged with the projecting portions of the tray without the need of the engagement between the fitting holes of the tray and the leading end portion of the transfer arm as in the conventional substrate transfer apparatus. Consequently, the possibility of the trouble related to the transfer as in the conventional case can be prevented.

In the substrate transfer apparatus according to one aspect of the present invention, the contact/engagement portion of the tray can be configured to be a cutout portion that is formed by cutting the both side edges of the tray, wherein the inward projecting end at the arm portion of the transfer arm is in contact with and engaged with or disengaged from the cutout portion. The shape of the cutout portion may be, for example, rectangular, square, trapezoidal, or triangle.

When the contact/engagement portion of the tray in the substrate transfer apparatus is configured as described above, the inward projecting end at the arm portion of the transfer arm is easily brought into contact with and engaged with the cutout portion serving as the contact/engagement portion of the tray. Therefore, the positioning between the transfer arm and the tray in the transfer direction is facilitated, whereby the trouble related to the transfer is more prevented.

In the substrate transfer apparatus according to one aspect of the present invention, the contact/engagement portion of the tray can be configured to be a projecting portion that is formed so as to partially project outwardly from the respective both side edges of the tray, wherein the inward projecting end at the arm portion of the transfer arm is in contact with and engaged with or disengaged from the projecting portion. The shape of the projecting portion may be, for example, rectangular, square, or trapezoidal.

When the contact/engagement portion of the tray in the substrate transfer apparatus is configured as described above, the inward projecting end at the arm portion of the transfer arm is easily brought into contact with and engaged with the projecting portion serving as the contact/engagement portion of the tray. Therefore, the positioning between the transfer arm and the tray in the transfer direction is facilitated, whereby the trouble related to the transfer is more prevented.

The projecting portion at the tray can be configured to have a cutout portion with a specific shape that is in contact with and engaged with or disengaged from the inward projecting end at the arm portion of the transfer arm. The specific shape of the cutout portion may be, for example, rectangular, square, trapezoidal, or triangle.

The transfer arm can be configured such that the inward projecting end at the arm portion has an engagement shape corresponding to the cutout portion of the projecting portion at the tray.

When the transfer arm is configured as described above, the inward projecting end at the arm portion is more surely in contact with and engaged with the cutout portion of the projecting portion at the tray, whereby the trouble related to the transfer is more prevented.

In the substrate transfer apparatus according to one aspect of the present invention, the respective both side edges of the tray can be configured such that the arm portion of each of the transfer arms is in contact therewith at plural portions.

When the both side edges of the tray in the substrate transfer apparatus are configured as described above, the arm portions of the respective transfer arms are in contact with the respective both side edges of the tray at plural portions, whereby the shake of the tray in the lateral direction during the transfer can be prevented.

Preferably, the contact/engagement portion of the tray is formed at plural portions at the respective both side edges of the tray, wherein a plurality of inward projecting ends are formed at the arm portions of the respective transfer arms so as to correspond to the contact/engagement portions of the tray.

When the contact/engagement portion of the tray and the inward projecting ends at the arm portion of the transfer arm in the substrate transfer apparatus are configured as described above, the plurality of inward projecting ends at the arm portions of the respective transfer arms are in contact with and engaged with the corresponding contact/engagement portions at plural portions at the respective both side edges of the tray. Therefore, the shake of the tray in the lateral direction during the transfer can more surely be prevented.

In the substrate transfer apparatus according to one aspect of the present invention, the transfer arm can be configured such that the inward projecting end at the arm portion can hold the contact/engagement portion of the tray as vertically nipping the same. The sectional shape of the inward projecting end at the arm portion, which can hold the contact/engagement portion of the tray as vertically nipping the same, may be a reversed C-shape, laid H-shape, rectangular shape, C-shape, <-shape, or the like, for example.

When the transfer arm in the substrate transfer apparatus is configured as described above, the shake of the tray in the vertical direction during the transfer can be prevented, since the inward projecting end at the arm portion of each of the transfer arms can hold the contact/engagement portion of the tray as vertically nipping the same.

In the substrate transfer apparatus according to one aspect of the present invention, it is preferable that the projecting portion of the tray has a engagement cutout portion having a specific shape, and the protrusions of the transfer member is formed into an engagement shape corresponding to the cutout portion of the projecting portion of the tray. The specific shape of the engagement cutout portion of the projecting portion at the tray may be, for example, rectangular, square, trapezoidal, or triangle.

When the projecting portion at the tray and the protrusions of the transfer member in the substrate transfer apparatus are configured as described above, the protrusions at the transfer member is easily in contact with and engaged with the projecting portion at the tray. Therefore, the positioning between the transfer arm and the tray in the transfer direction is facilitated, whereby the trouble related to the transfer is more prevented.

In the substrate transfer apparatus according to one aspect of the present invention, it is preferable that a pair of the transfer members is provided for each guide plate in each of the plurality of vacuum chambers. At least one of the plurality of the vacuum chambers are specified as a plasma processing chamber for performing a plasma process to a plate-like subject to be processed such as a substrate. The other vacuum chamber is specified, for example, as a subject-to-be-processed discharging chamber connected to the plasma processing chamber for discharging the subject to be processed. These vacuum chambers have a structure that can be sealed. There is no limitation on the shape and material of the vacuum chambers, so long as they can endure a predetermined atmospheric pressure and temperature.

When a pair of transfer members is provided for each guide plate in the plurality of vacuum chambers in the substrate transfer apparatus, the floated tray can more smoothly be transferred from the guide plate of one vacuum chamber to the other guide plate in the adjacent vacuum chamber, whereby the trouble related to the transfer can more be prevented.

Three preferable embodiments of the present invention will be described with reference to the FIGS. 1 to 15 as accompanying drawings. It is to be noted that the present invention is not limited by these embodiments.

First Embodiment

Figure 2:
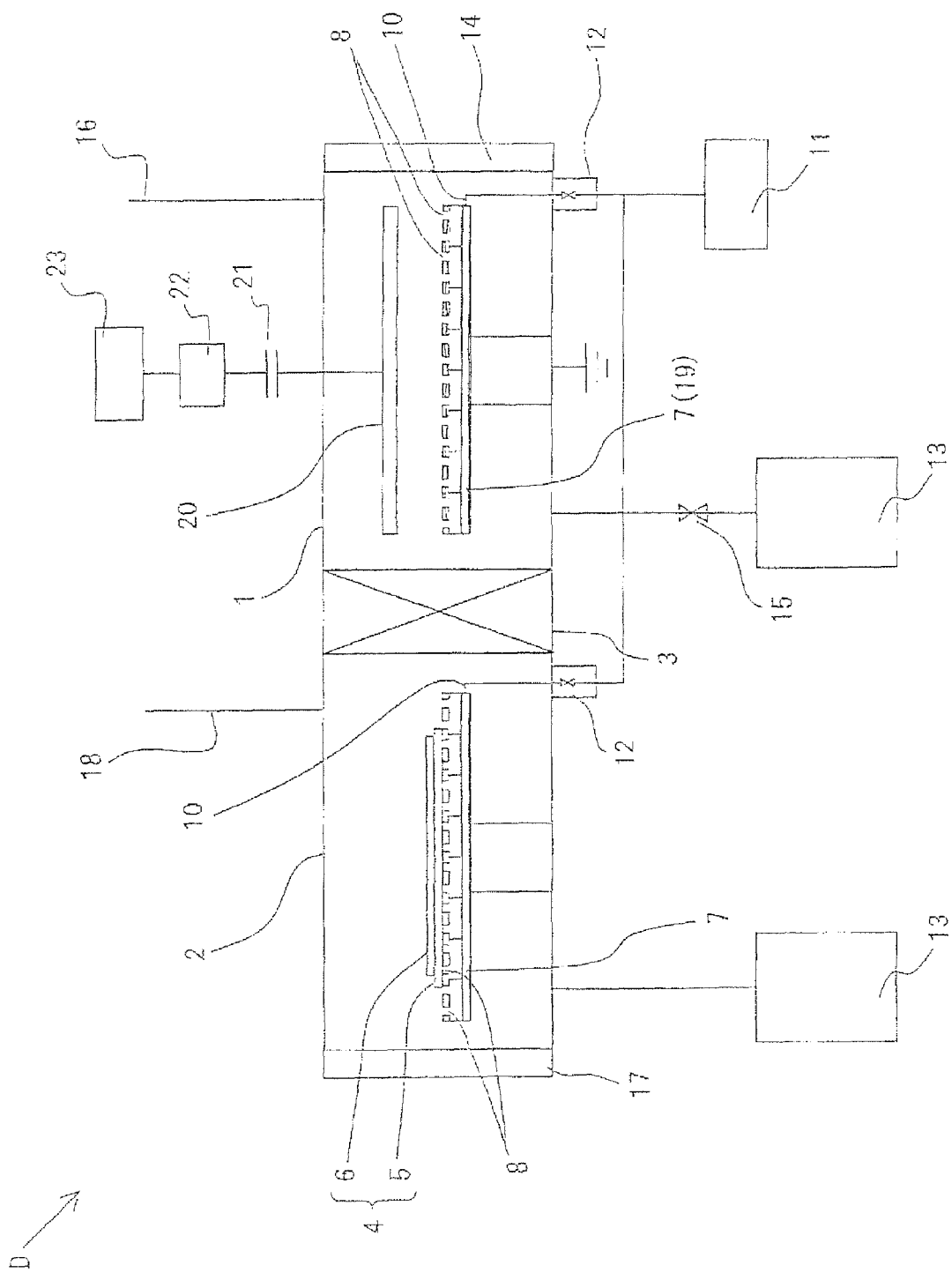
FIG. 2 is a view for explaining the configuration of the substrate transfer apparatus shown in FIG. 1.
Figure 3:
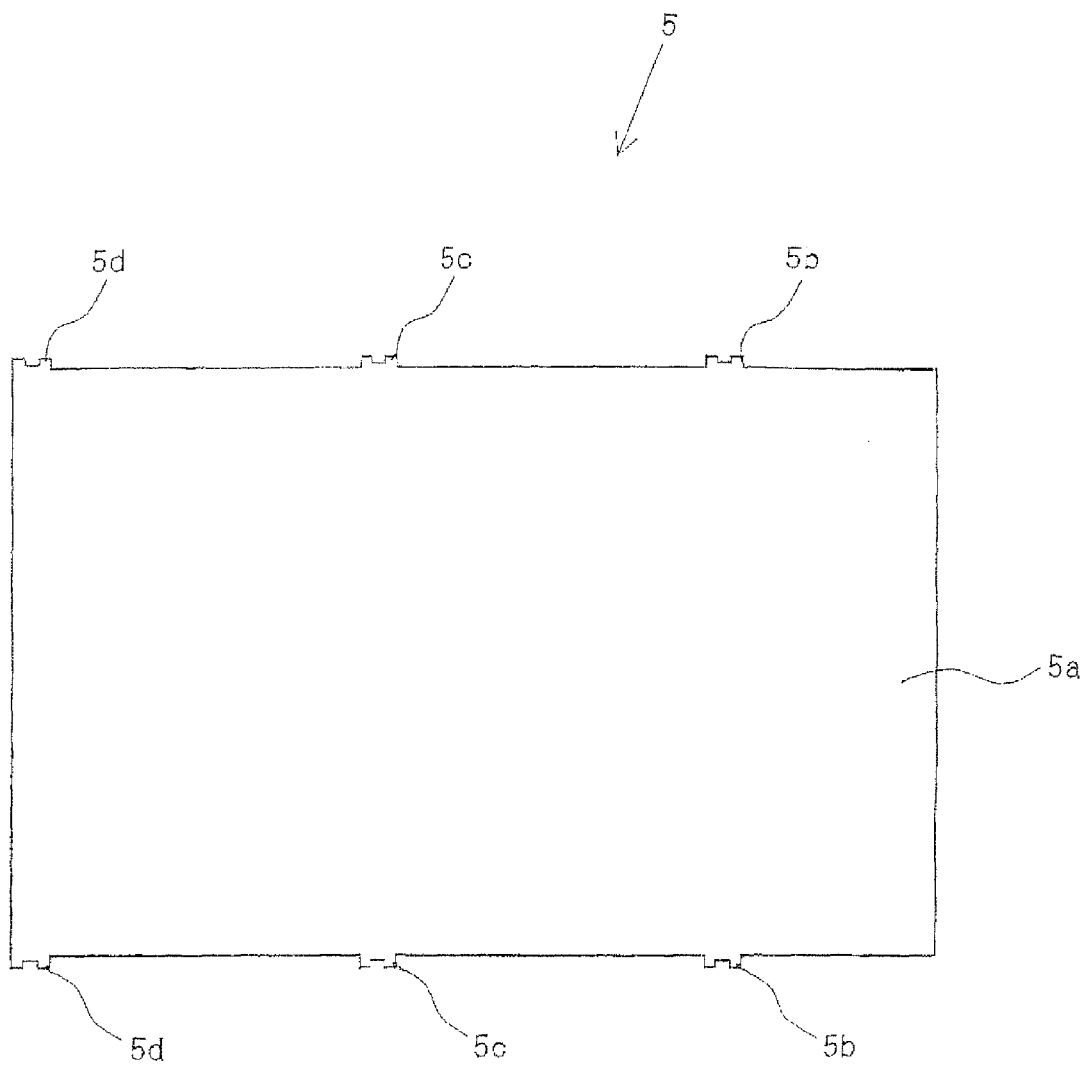
FIG. 3 is a plan view of a tray, which is one component in the substrate transfer apparatus shown in FIG. 1.
Figure 4:
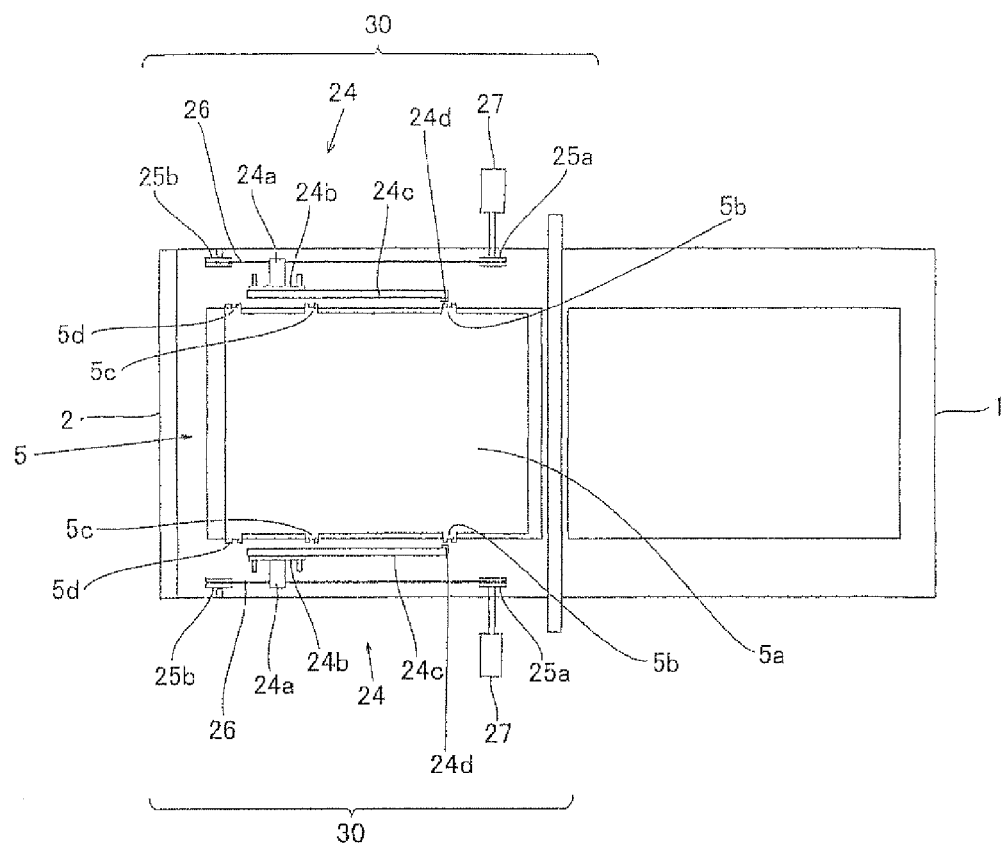
FIG. 4 is a plan view of the substrate transfer apparatus shown in FIG. 1.

FIG. 1 is a partially cutout perspective view of a substrate transfer apparatus, which is incorporated in a plasma processing apparatus, according to a first embodiment of the present invention. FIG. 2 is a view for explaining the configuration of the substrate transfer apparatus shown in FIG. 1. FIG. 3 is a plan view of a tray, which is one component in the substrate transfer apparatus shown in FIG. 1. FIG. 4 is a plan view of the substrate transfer apparatus shown in FIG. 1.

As shown in FIGS. 1 and 2, the substrate transfer apparatus D according to the first embodiment of the present invention is incorporated in a plasma processing apparatus. The substrate transfer apparatus D has a first vacuum chamber 1 and a second vacuum chamber 2 that are adjacent to each other with a space from the upstream side to the downstream side in a transfer direction. These two vacuum chambers 1 and 2 are configured such that one casing linearly extending in a longitudinal direction is divided into two by a single separation gate valve 3 that can be opened and closed. The vacuum chambers 1 and 2 are made of stainless steel, and a mirror finish is provided on an inner surface thereof. The gate valve 3 is configured to be capable of moving up and down. The gate valve 3 allows the adjacent two vacuum chambers 1 and 2 to communicate with each other when it is at the moving-up position, while it allows the adjacent two vacuum chambers 1 and 2 to be separated from each other when it is at the moving-down position.

The first vacuum chamber 1 is defined as a plasma processing chamber for performing a plasma process to a plate-like subject to be processed 4 having a flat plate shape (here, it is a tray 5 and a plasma processing substrate 6 to be mounted on the tray 5) transferred here from the upstream side in the transfer direction. The second vacuum chamber 2 is defined as a subject-to-be-processed discharging chamber for discharging the subject to be processed 4 to which the plasma process is performed in the plasma processing chamber that is the first vacuum chamber 1.

The plasma processing chamber 1 serving as the first vacuum chamber and the subject-to-be-processed discharging chamber 2 serving as the second vacuum chamber are provided with guide plates 7 that are rectangular flat plates, and are used for a floating transfer, and on which the subject to be processed 4 is placed. These guide plates 7, 7 are also made of stainless steel, and have partially a hollow structure as described later. The respective guide plates 7, 7 are subject to a mirror finish on the surface thereof, and have a width (a length of a short side) of 600 mm, a length (a length of a long side) of 1000 mm, and a thickness of 30 mm. The two guide plates 7, 7 are arranged on one line along the transfer direction in the plasma processing chamber 1 and the subject-to-be-processed discharging chamber 2 that are adjacent to each other via the gate valve 3. Each of the guide plates 7 has incorporated therein a heater (not shown) for heating the substrate 6.

As shown in FIGS. 1 and 2, each of the guide plates 7 is formed with a plurality of floating gas ejecting holes 8, . . . 8. Specifically, 128 circular gas ejecting holes in total 8, . . . 8 are formed on a top surface of each of the guide plates 7, in which 8 holes are formed in one row in a direction in which the short side of a rectangle extends (the direction orthogonal to the transfer direction), and the holes are formed in 16 rows in a direction in which the long side of the rectangle extends (the direction parallel to the transfer direction). The diameter of each of the gas ejecting holes 8 is 1.0 mm.

These 128 gas ejecting holes 8, . . . 8 are divided into independent 8 band-like ejecting hole groups 9, . . . 9 including 2 rows having 16 holes. These ejecting hole groups 9, . . . 9 are transversely formed in the transfer direction, which is the direction in which the long side of the guide plate 7 extends, and formed with a predetermined space in the transfer direction.

Each of the guide plates 7 has 8 inner grooves (not shown) corresponding to 8 band-like ejecting hole groups 9, . . . 9, which are transversely formed in the transfer direction, and formed with a predetermined space in the transfer direction, and 8 floating gas supplying tubes 10, . . . 10 that are connected so as to communicate with these inner grooves and extend along the transfer direction in the guide plate 7. Since the guide plate 7 is formed with the inner grooves, the guide plate 7 is hollow at the portions of the inner grooves.

As shown in FIG. 2, the substrate transfer apparatus D has a gas supplying source 11 for supplying the floating gas to the guide plates 7, 7 in the plasma processing chamber 1 and the subject-to-be-processed discharging chamber 2. The gas supplying source 11 is connected to the gas supplying tubes 10, . . . 10 of the guide plates 7, 7 through floating-gas supplying valves 12, 12 provided at an outside of a bottom wall of the plasma processing chamber 1 and the subject-to-be-processed discharging chamber 2.

The plasma processing chamber 1 and the subject-to-be-processed discharging chamber 2 are connected to external vacuum pumps 13, 13. A door 14 for carrying in the subject to be processed is provided at an inlet side of the plasma processing chamber 1. The plasma processing chamber 1 is connected to the vacuum pump 13 below the chamber 1 via a pressure regulating valve 15 for keeping the interior of the chamber to have a predetermined vacuum. The plasma processing chamber 1 is also connected at the upper side to a reaction gas introducing tube 16 for introducing a reaction gas for the plasma process. A door 17 for discharging the subject to be processed is provided to the subject-to-be-processed discharging chamber 2 at its outlet side. The subject-to-be-processed discharging chamber 2 is also connected at the upper side to a leak gas introducing tube 18.

The guide plate 7 in the plasma processing chamber 1 also serves as a plasma-processing anode electrode 19. A plasma-processing cathode electrode 20 is provided above the anode electrode 19 so as to oppose to the anode electrode 19. The cathode electrode 20 is electrically connected to a high-frequency power supply 23 through a condenser 21 and a rectifying circuit 22 at the outside of the plasma processing chamber 1.

As shown in FIGS. 1 and 2, a single plate-like tray 5 is placed onto the guide plate 7 in the subject-to-be-processed discharging chamber 2. The tray 5 is made of stainless steel, and has a rectangular planar shape. A back surface of the tray 5 (the opposite surface of the guide plate 7) is subject to a mirror finish in order to realize a smooth transfer. The tray 5 has a width (a length of a short side) of 605 mm, a length (a length of a long side) of 900 mm, and a thickness of 2 mm. The tray 5 is placed onto the guide plate 7 for having the substrate 6, which is to be transferred, mounted thereon, and floated by means of a floating gas.

As shown in FIG. 3, the tray 5 has a rectangular main body 5a having both side edges parallel to the transfer direction, and six projecting portions 5b, 5b, 5c, 5c, 5d, and 5d, which are formed to partially project from both side edges of the main body 5a and are brought into contact with and engaged with the transfer arm 24 or disengaged therefrom when the tray 5 is transferred by the later-described transfer arm 24.

The projecting portions 5b, 5b, 5c, 5c, 5d, and 5d of the tray 5 are made up of the first projecting portions 5b, 5b formed at the position of the side edge in the main body 5a close to the upstream side in the transfer direction, second projecting portions 5c, 5c formed at the middle position apart from the first projecting portions 5b, 5b with a predetermined space toward the downstream side in the transfer direction, and third projecting portions 5d, 5d formed at the end position communicating with the end portions at the downstream side in the transfer direction apart from the second projecting portions 5c, 5c with a predetermined space toward the downstream side in the transfer direction. Each of the projecting portions 5b, . . . 5d has an U-shaped planar shape. Specifically, each of the projecting portions 5b, . . . 5d is formed to have an U-shaped planar shape has a pair of projecting portion as shown in FIG. 3, wherein it has a rectangular shape including a base-side edge portion communicating with one side edge of the main body 5a and a projecting-side edge portion extending parallel to the base-side edge portion with a predetermined space, in which a small rectangular region including the middle portion of the projecting-side edge portion is cut out.

The substrate transfer apparatus D has transfer function units 30, 30 provided to the subject-to-be-processed discharging chamber 2. The transfer function units 30, 30 allow the subject to be processed 4 placed onto the guide plate 7 to float, and transfer the floated subject to be processed 4 between the plasma processing chamber 1 and the subject-to-be-processed discharging chamber 2 along the guide plates 7, 7 with external force. The floating transfer by the transfer function units 30, 30 will be described with reference to FIGS. 1 to 4 below.

In FIG. 1, each of the transfer function units 30, 30 moves the subject to be processed 4 between the plasma processing chamber 1 and the subject-to-be-processed discharging chamber 2. Each of the transfer function units 30, 30 has a transfer arm 24 arranged along both side edges of the subject to be processed 4 in the subject-to-be-processed discharging chamber 2, a pair of pulleys (a drive pulley 25a and a driven pulley 25b) arranged in the transfer direction with a space, a wire 26 looped around these pulleys 25a and 25b, and a motor 27 connected to the drive pulley 25a.

A spring 29 that is urged in a direction of taking up the slack of the wire 26 is mounted to the driven pulley 25b. The spring 29 pulls the driven pulley 25b in the direction parallel to the transfer direction, so that the tension of the wire 26 is kept to be constant.

As shown in FIGS. 1 and 4, the transfer arm 24 includes a base portion 24a, a guide portion 24b, and an arm portion 24c.

A part of the transfer arm 24 is coupled to the wire 26, and placed onto a rail 28 (not shown in FIG. 4) provided horizontally at the rearward of the bottom surface of the subject-to-be-processed discharging chamber 2.

Specifically, the base portion 24a is coupled to the wire 26 and mounted to the rail 28, so that the base portion 24a can reciprocate horizontally along the rail 28. The guide portion 24b can reciprocate horizontally in the direction orthogonal to the transfer direction at the base portion 24a. The arm portion 24c is provided horizontally in the direction parallel to the transfer direction at the guide portion 24b, and provided so as to be positioned at the side of the placed tray 5. The moving distance of the arm portion 24c in the transfer direction is set to be 650 mm.

Figure 5:
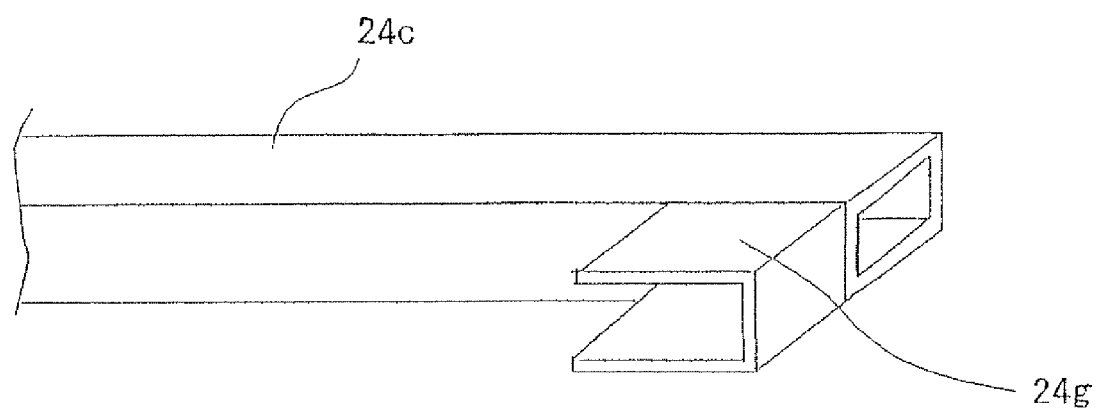
FIG. 5 is a perspective view of an arm portion of a transfer arm, which is one component of the substrate transfer apparatus shown in FIG. 4.

The arm portion 24c is formed with an inward projecting end 24d at its free end. The inward projecting end 24c is formed into a reversed C-shape viewed from the front as shown in FIG. 5. Due to the reciprocating movement of the guide portion 24b, it is brought into contact with and engaged with the respective projecting parts of the concave first to the third projecting portions 5b, ... 5d at the tray 5 from the outer side to the inner side or is disengaged therefrom from the inner side to the outer side.

More specifically described, the guide portion 24b is provided above the base portion 24a so as to be capable of horizontally reciprocating in the direction orthogonal to the transfer direction via a pair of guide shafts that is integrated with the base portion 24a. The arm portion 24c is formed integral with the guide portion 24b, so that it reciprocates with the base portion 24a in the direction parallel to the transfer direction.

Due to the reciprocating movement of the guide portion 24b, the arm portion 24c is apart from the rail 28 or close to the rail 28 with the parallel relationship between the arm portion 24c and the rail 28 maintained. With the movement of the arm portion 24c described above, the inward projecting end 24d at the arm portion 24c is brought into contact with one of the projecting parts of the projecting portions 5b, ... 5d at the tray 5 so as to be engaged therewith from the outer side (the side more apart from the side edge of the main body 5a of the tray 5) toward the inner side (the side closer to the side edge of the main body 5a of the tray 5), or disengaged therefrom from the inner side toward the outer side.

The plasma processing apparatus D further includes a sensor (not shown) for detecting the position of the tray 5 that is now being transferred, and a control function unit (not shown) for performing a predetermined control.

The control function unit mainly performs the control described below. Specifically, it opens the gate valve 3 so as to allow the adjacent plasma processing chamber 1 and the subject-to-be-processed discharging chamber 2 to communicate with each other. Further, the control function unit allows the floating gas to be ejected from the gas ejecting holes 8, ... 8 at the guide plates 7, 7 in the plasma processing chamber 1 and the subject-to-be-processed discharging chamber 2. Then, the control function unit causes the floating gas to be sequentially ejected from the ejecting hole groups 9, ... 9 involved with the floating of the subject to be processed 4 in the plasma processing chamber 1 and the subject-to-be-processed discharging chamber 2 in order to make the floating transfer control for transferring the subject to be processed 4 (tray 5+substrate 6), which is floated by the ejected floating gas, along the guide plates 7, 7 by the transfer function units 30, 30. The control function unit also sequentially stops the ejection of the floating gas from the ejecting hole groups 9, ... 9 that are not involved with the floating of the subject to be processed 4.

A subject-to-be-processed carrying-in chamber (not shown) is provided at the upstream side of the plasma processing chamber 1 in the transfer direction in FIGS. 1 and 2. In the subject-to-be-processed carrying-in chamber, a floating-transfer guide plate (not shown) on which the subject to be processed 4 (tray 5+substrate 6) is placed and a transfer function unit (not shown) are provided. The substrate 6 is mounted on the guide plate via the tray 5. With this state, the tray 5 in the subject-to-be-processed carrying-in chamber covers the central six ejecting hole groups of eight band-like ejecting hole groups, like the subject-to-be-processed discharging chamber 2 shown in FIGS. 1 and 2. The transfer function unit in the subject-to-be-processed carrying-in chamber has the structure same as that of the transfer function units 30, 30 in the subject-to-be-processed discharging chamber 2. The transfer function units in the subject-to-be-processed carrying-in chamber are provided so as to be symmetry with the transfer function units 30, 30 in the subject-to-be-processed discharging chamber 2 with respect to a plane.

The floating transfer operation of the plasma processing apparatus D will be described below, wherein the operation is made by the combination of the transfer function units in the subject-to-be-processed carrying-in chamber, the transfer function units 30, 30 in the subject-to-be-processed discharging chamber 2, and the control function unit. The components in the subject-to-be-processed carrying-in chamber corresponding to the components in the subject-to-be-processed discharging chamber 2 are indicated by numerals in parentheses (for example, "guide plate (7)" for descriptive purposes.

The control function unit causes the floating gas (here, nitrogen gas) to eject from the gas ejecting holes (8, ... 8) on the guide plate (7) in the subject-to-be-processed carrying-in chamber, so that the subject to be processed (4) is floated from the guide plate (7). The control function unit moves the transfer arm (24) horizontally along the rail (28) toward the downstream side in the transfer direction, wherein the inward projecting end (24d) at the arm portion (24c) move from the outer side toward the inner side to be brought into contact with and engaged with the third projecting portion (5d) at the end of the tray (35) at the downstream side in the transfer direction. In this case, the tray (5) is floated, whereby the arm portion (24c) of the transfer arm (24) can smoothly transfer the tray (5) with slight force.

The control function unit does not cause the floating gas to be ejected from all gas ejecting holes (8, ... 8) on the guide plates (7) all at once, but causes the floating gas to be sequentially ejected from the ejecting hole groups (9, ... 9) involved with the floating of the subject to be processed (4). Specifically, the control function unit causes the floating gas to be sequentially ejected from the ejecting hole groups (9, ... 9) involved with the floating of the subject to be processed (4), and sequentially stops the ejection of the floating gas from the ejecting hole groups (9, ... 9) that become uninvolved with the floating of the subject to be processed (4), according to the position of the tray (5) detected by the sensor, which detects the position of the tray (5) that is being transferred.

The ejection of the floating gas described above is executed by the control function unit that operates the flow rate regulating valve 12 connected to the respective gas supplying sources 11.

The sequential ejection and sequential stop of the ejection of the floating gas by the control function unit described above is continuously done even in a state in which the leading end of the tray (5) in the advancing direction is transferred from the guide plate (7) in the subject-to-be-processed carrying-in chamber to the guide plate 7 in the plasma processing chamber 1 according to the progress of the transfer of the tray (5).

When the arm portion (24c) of the transfer arm (24) horizontally moves toward the downstream side in the transfer direction with a fixed distance in the subject-to-be-processed carrying-in chamber, the inward projecting end (24d) of the arm portion (24c) moves from the inner side toward the outer side to be disengaged from the third projecting portion (5d) at the tray (5). Then, the arm portion (24c) further horizontally moves toward the downstream side in the transfer direction with a fixed distance, wherein the inward projecting end (24d) moves again from the outer side toward the inner side to be in contact with and engaged with the second projecting portion (5c) at the tray (5). Thereafter, the inward projecting end (24d) of the arm portion (24c) moves again from the inner side toward the outer side to be disengaged from the second projecting portion (5c) at the tray (5).

Then, the arm portion (24c) further horizontally moves toward the downstream side in the transfer direction with a fixed distance, wherein the inward projecting end (24d) moves again from the outer side toward the inner side to be in contact with and engaged with the first projecting portion (5b) at the tray (S). As a result, the tray (5) and the substrate (6) in the subject-to-be-processed carrying-in chamber are transferred to the central position of the guide plate 7 in the plasma processing chamber 1, whereby it is sandwiched between the guide plate 7, serving as the anode electrode, and the cathode electrode 20 above the guide plate 7.

Next, the control function unit stops the ejection of the floating gas from the guide plate 7 in the plasma processing chamber 1, and places the tray 5 onto the guide plate 7 for positioning. Then, the gate valve, which is at the lifted position, is moved down to again separate the subject-to-be-processed carrying-in chamber and the plasma processing chamber 1.

Then, the control function unit operates the vacuum pump 13 (see FIG. 2) connected to the plasma processing chamber 1 so as to keep the plasma processing chamber 1 to have a predetermined vacuum. Thereafter, a predetermined plasma process is performed to the substrate 6 on the tray 5 by the guide plate 7, serving as the anode electrode, and the cathode electrode 20 above the guide plate 7.

The substrate 6 that is subject to the predetermined plasma process in the plasma processing chamber 1 is floated and transferred, as being mounted on the tray 5, to the subject-to-be-processed discharging chamber 2 by the transfer function units 30, 30 in the subject-to-be-processed discharging chamber 2 and the control function unit. The description relating to the floating of the tray 5 is substantially the same as that mentioned above, so that the description will not be repeated.

By means of the control function unit, the arm portion 24c of the transfer arm 24 of each of the transfer function units 30 horizontally moves toward the downstream side in the transfer direction along the corresponding rail 28 with a fixed distance, wherein the inward projecting end 24d moves from the outer side toward the inner side to be in contact with and engaged with the third projecting portion 5d, which is at the end of the tray 5 having the substrate 6 mounted thereon in the plasma processing chamber 1 at the downstream side in the transfer direction. By virtue of this movement, the inward projecting end 24d at the arm portion 24c of each of the transfer arms 24 move from the inner side toward the outer side to be disengaged from the third projecting portion 5d at the tray 5.

Then, the arm 24c further horizontally moves toward the downstream side in the transfer direction with a fixed distance, wherein the inward projecting end 24d moves again from the outer side toward the inner side to be in contact with and engaged with the second projecting portion 5c formed at the middle portion of the tray 5. By virtue of this movement, the inward projecting end 24d at the arm portion 24c again moves from the inner side toward the outer side to be disengaged from the second projecting portion 5c at the tray 5. Thereafter, the arm portion 24c further horizontally moves toward the downstream side in the transfer direction with a fixed distance, wherein the inward projecting end 24d is in contact with and engaged with the first projecting portion 5b formed at the position close to the end of the tray 5 at the upstream side in the transfer direction. Consequently, the tray 5 and the substrate 6 in the plasma processing chamber 1 are transferred to the central position on the guide plate 7 in the subject-to-be-processed discharging chamber 2 as shown in FIGS. 1 and 2.

According to the substrate transfer apparatus D according to the first embodiment of the present invention, the inward projecting end 24d at the arm portion 24c of the transfer arm 24 are brought into contact with and engaged with one of the projecting portions 5b, . . . 5d at the tray 5 from the outer side to the inner side due to the horizontal reciprocating movement of the guide portion 24b. The tray 5 can be transferred as floated with the state in which the arm portion 24c of the transfer arm 24 is engaged with the projecting portions 5b, . . . 5d at the tray 5, without the engagement between the fitting holes at the tray and the leading end of the transfer arm as in the conventional substrate transfer apparatus. Therefore, the possibility of the trouble related to the transfer as in the conventional case can be prevented.

Second Embodiment

Figure 6:
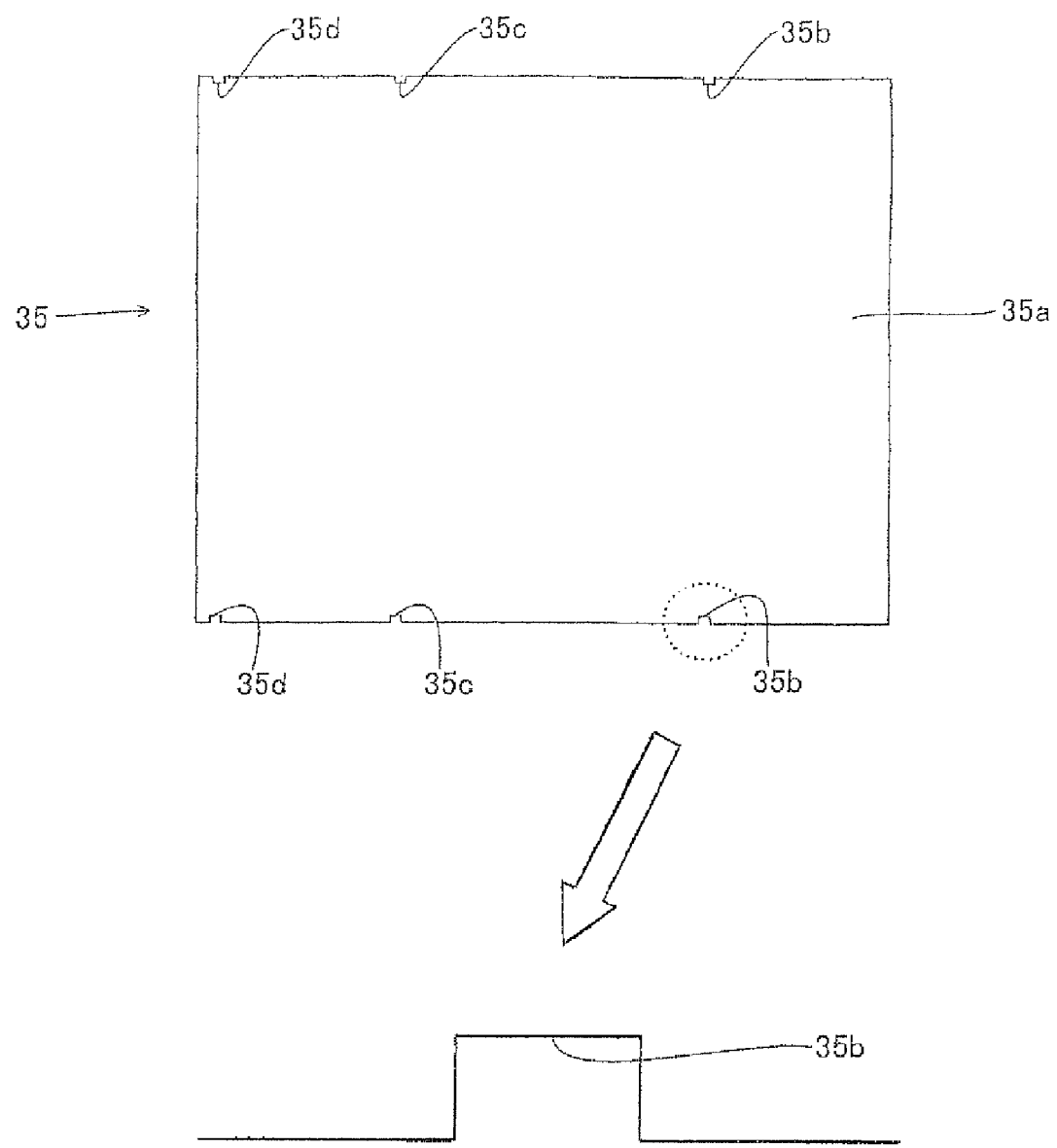
FIG. 6 is a plan view of a tray, which is one component of a substrate transfer apparatus that is incorporated in a plasma processing apparatus according to a second embodiment of the present invention.

FIG. 6 is a plan view of a tray, which is one component of a substrate transfer apparatus incorporated in a plasma processing apparatus according to a second embodiment of the present invention. FIGS. 7 to 10 are plan views for explaining the procedure of the transfer by the substrate transfer apparatus according to the second embodiment of the present invention.

The substrate transfer apparatus according to the second embodiment includes the subject-to-be-processed discharging chamber, plasma processing chamber, subject-to-be-processed carrying-in chamber, and transfer arm 24 (see FIGS. 4 and 5), those of which are the same as those in the substrate transfer apparatus D in the first embodiment. As shown in FIG. 6, in the substrate transfer apparatus, a tray 35 is used instead of the tray 5 in the substrate transfer apparatus D in the first embodiment. Like the tray 5 in the first embodiment, the tray 35 is made of stainless steel, and its back surface is subject to a mirror finish for realizing a smooth transfer.

The tray 35 has a rectangular main body 35a having both side edges parallel to the transfer direction, and six cutout portions 35b, 35b, 35c, 35c, 35d, and 35d, which are formed into a recessed shape at both side edges of the main body 35a. The cutout portions 35b and 35b are specified as first cutout portions formed at the position close to the upstream side of the tray 35 in the transfer direction, the cutout portions 35c and 35c are specified as second cutout portions formed at the middle position of the tray 35, and the cutout portions 35d and 35d are specified as third cutout portions formed at the end position of the tray 35 at the downstream side in the transfer direction. These cutout portions 35b, . . . 35d are brought into contact with and engaged with the inward projecting end 24d at the arm portion 24c of the transfer arm 24 from the outer side toward the inner side or disengaged therefrom from the inner side toward the outer side, when the tray 35 is transferred by the transfer arm 24.

The other configuration of the substrate transfer apparatus in the second embodiment is substantially the same as that of the substrate transfer apparatus D in the first embodiment.

Next, the procedure of the transfer by the substrate transfer apparatus according to the second embodiment of the present invention will be described with reference to FIGS. 7 to 10.

Figure 7:
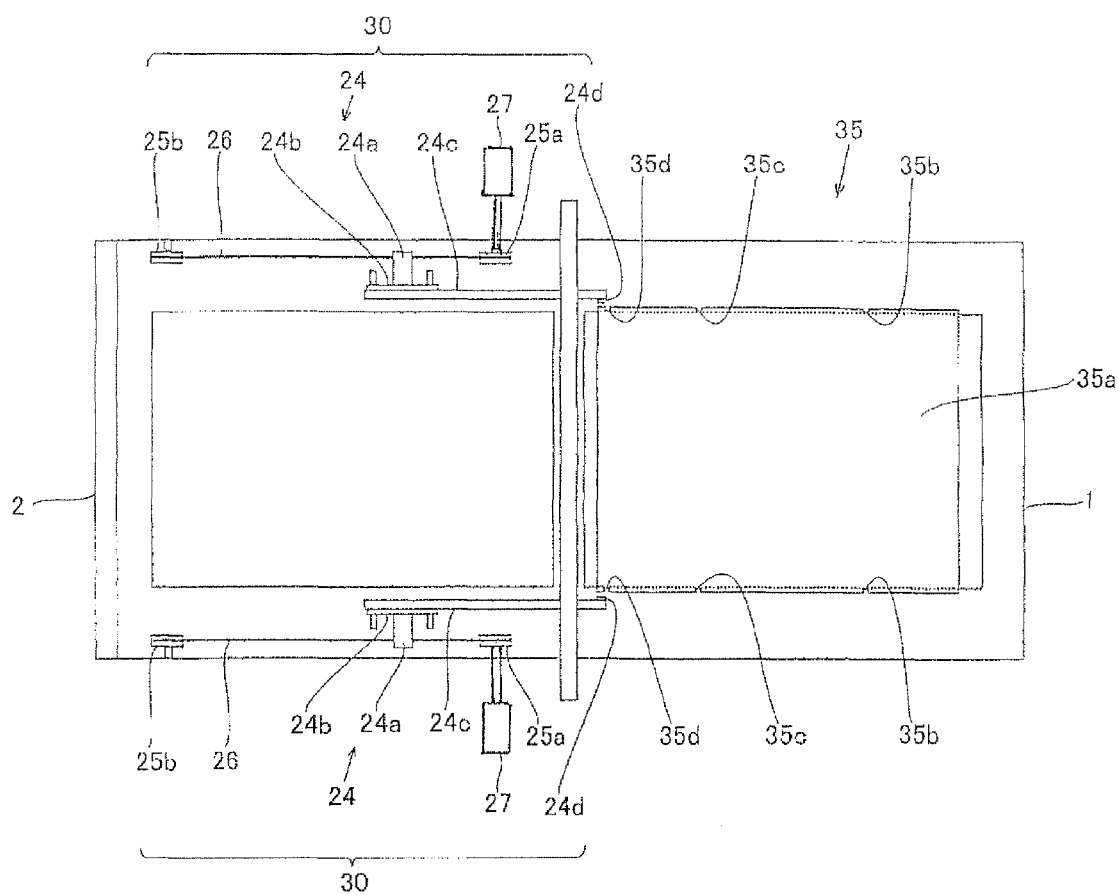
FIG. 7 is a plan view for explaining a procedure of a transfer by the substrate transfer apparatus according to the second embodiment of the present invention.

As shown in FIG. 7, the substrate (not shown) that is subject to the predetermined plasma process in the plasma processing chamber 1 is floated and transferred, as being mounted on the tray 35, to the subject-to-be-processed discharging chamber 2 by the transfer function units 30, 30 in the subject-to-be-processed discharging chamber 2 and the control function unit.

By means of the control function unit, the arm portion 24*c* of the transfer arm 24 horizontally moves toward the downstream side in the transfer direction along the corresponding rail (not shown in FIG. 7), wherein the inward projecting end 24*d* moves from the outer side toward the inner side to be in contact with and engaged with the third cutout portion 35*d* of the tray 35 due to the inward movement of the guide portion 24*b*. FIG. 7 indicates the state before the inward projecting ends 24*d* of the respective arm portions 24*c* are in contact with and engaged with the third cutout portion 35*d* at the tray 35.

The tray 35 is firstly moved toward the downstream side in the transfer direction along the rail by a first predetermined distance with the inward projecting end 24*d* of the arm portion 24*c* being in contact with and engaged with the third cutout portion 35*d* at the tray 35. The first predetermined distance means the distance between the third cutout portion 35*d* at the tray 35 and the second cutout portion 35*c*.

Figure 8:
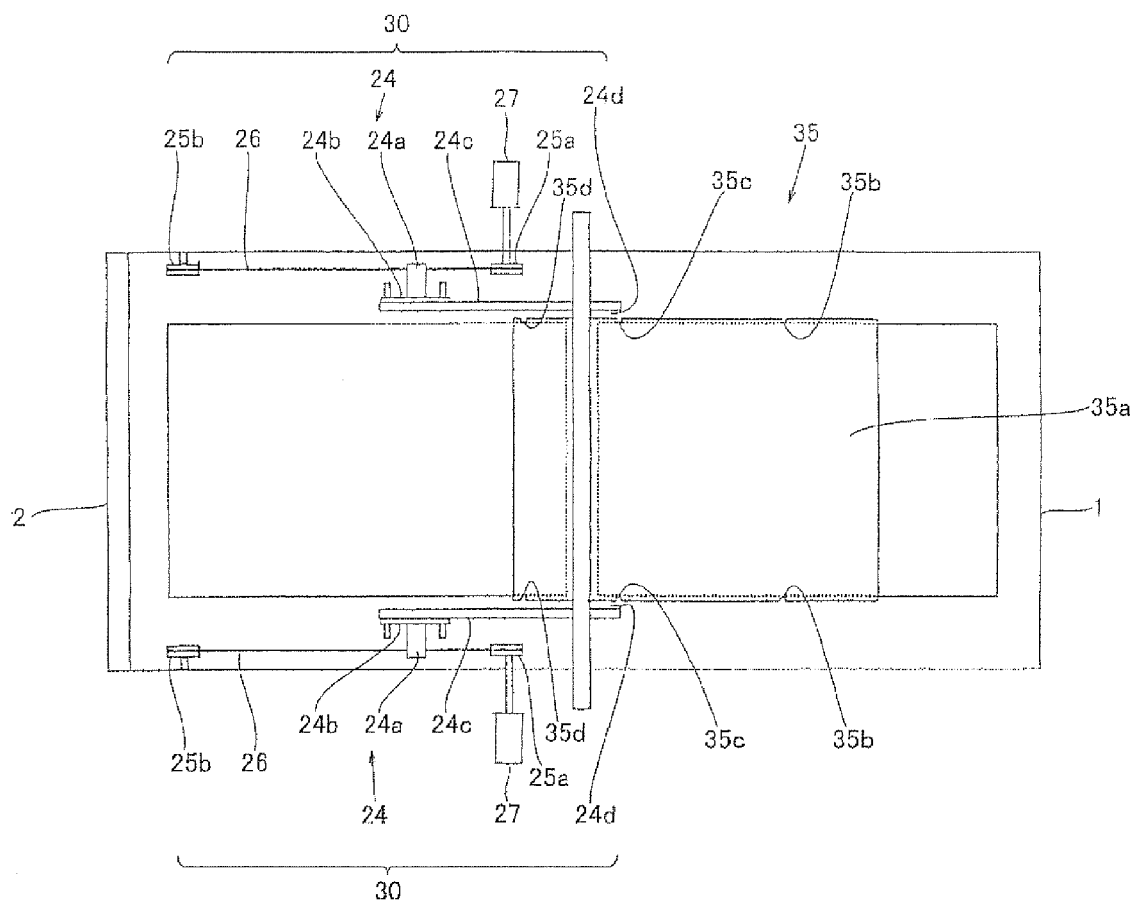
FIG. 8 is a plan view for explaining a procedure of a transfer by the substrate transfer apparatus according to the second embodiment of the present invention.

The procedure will next be described with reference to FIG. 8. The tray 35 that is moved by the first predetermined distance is stopped with a part thereof entering the subject-to-be-processed discharging chamber 2. Then, the inward projecting end 24*d* at the arm portion 24*c* moves from the inner side toward the outer side by the outward movement of the guide portion 24*b*, thereby being disengaged from the third cutout portion 35*d* at the tray 35. Next, the arm portion 24*c* is returned toward the upstream side in the transfer direction by the first predetermined distance. In this case, the inward projecting end 24*d* at the arm portion 24*c* is located at the position opposite to the second cutout portion 35*c* at the tray 35.

Thereafter, the tray 35 is moved toward the downstream side in the transfer direction by a second predetermined distance along the rail, in which the inward projecting end 24*d* at the arm portion 24*c* moves from the outer side toward the inner side to be in contact with and engaged with the second cutout portion 35*c* at the tray 35. The second predetermined distance means here the distance between the second cutout portion 35*c* at the tray 35 and the first cutout portion 35*b*.

Figure 9:
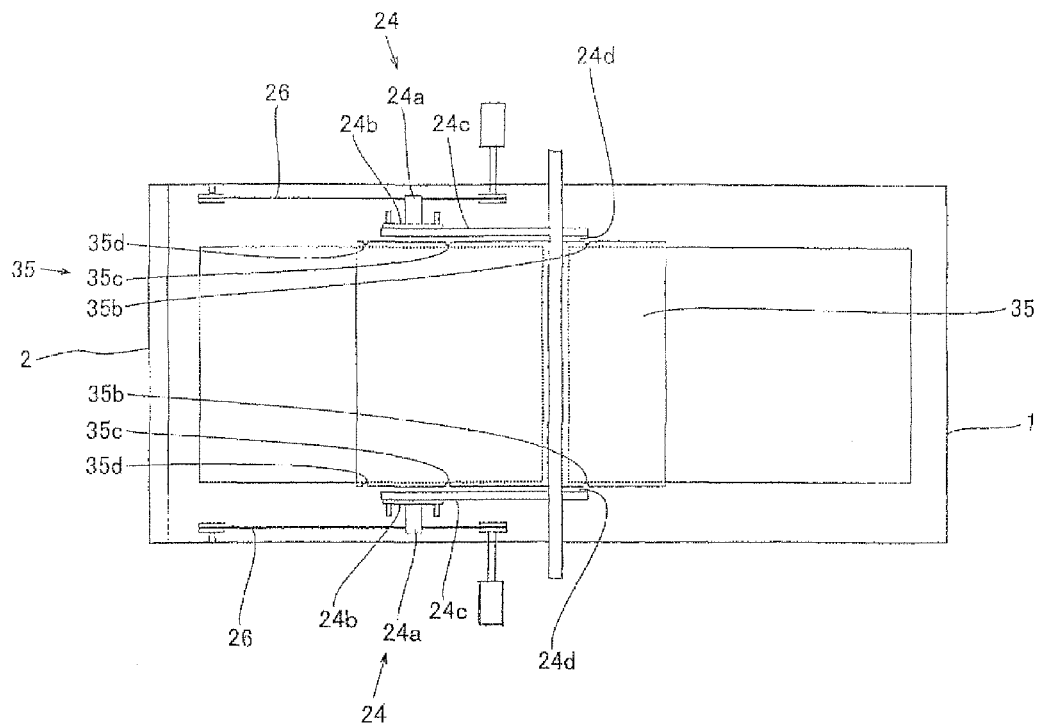
FIG. 9 is a plan view for explaining a procedure of a transfer by the substrate transfer apparatus according to the second embodiment of the present invention.

The procedure will next be described with reference to FIG. 9. The tray 35 that is moved by the second predetermined distance is stopped with a part thereof remaining in the plasma processing chamber 1. Then, the inward projecting end 24*d* at the arm portion 24*c* moves from the inner side toward the outer side by the outward movement of the guide portion 24*b*, thereby being disengaged from the second cutout portion 35*c* at the tray 35. Next, the arm portion 24*c* is returned toward the upstream side in the transfer direction by the second predetermined distance. In this case, the inward projecting end 24*d* at the arm portion 24*c* is located at the position opposite to the first cutout portion 35*b* at the tray 35.

Thereafter, the tray 35 is moved toward the downstream side in the transfer direction by a third predetermined distance along the rail, in which the inward projecting end 24*d* at the arm portion 24*c* moves from the outer side toward the inner side to be in contact with and engaged with the first cutout portion 35*b* at the tray 35. The third predetermined distance means here the distance between the first cutout portion 35*b* at the tray 35 and the end of the tray 35 at the upstream side in the transfer direction.

Figure 10:
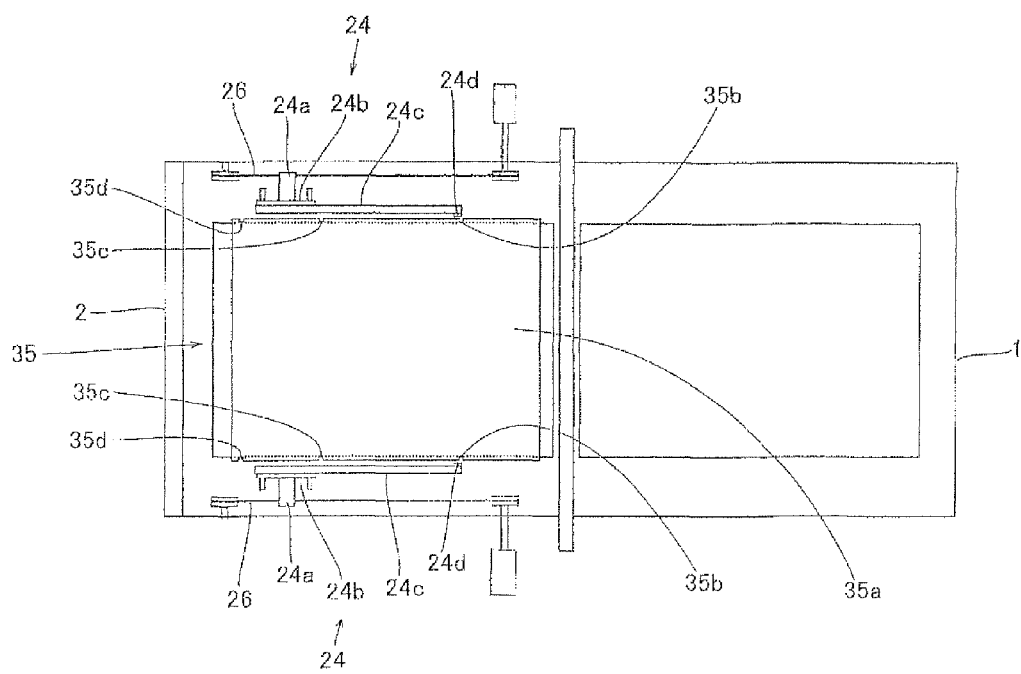
FIG. 10 is a plan view for explaining a procedure of a transfer by the substrate transfer apparatus according to the second embodiment of the present invention.

The procedure will next be described with reference to FIG. 10. The tray 35 that is moved by the third predetermined distance is stopped with the overall thereof entering the subject-to-be-processed discharging chamber 2. Then, the inward projecting end 24*d* at the arm portion 24*c* moves from the inner side toward the outer side by the outward movement of the guide portion 24*b*, thereby being disengaged from the first cutout portion 35*b* at the tray 35.

Modification of Second Embodiment

FIGS. 11 to 14 show the procedure of the transfer by the substrate transfer apparatus by means of the transfer arm 24, according to the modification, provided with a second inward projecting end 24*e* formed at the portion close to a fixed end, in addition to the inward projecting end (first projecting end) 24*d* formed at the free end of the transfer arm 24 in the second embodiment. The second inward projecting end 24*e* is configured to have the shape same as that of the first inward projecting end 24*d*. The distance between the first inward projecting end 24*d* and the second inward projecting end 24*e* is set to be equal to the second predetermined distance.

Figure 11:
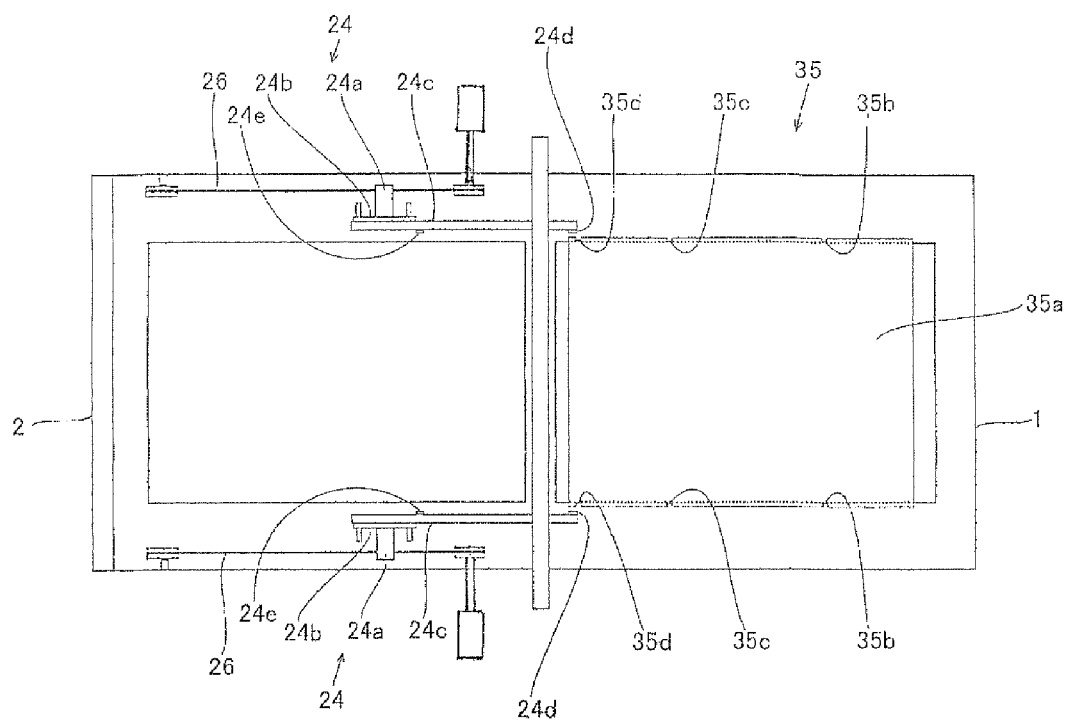
FIG. 11 is a plan view for explaining a procedure of a transfer by the substrate transfer apparatus according to a modification of the second embodiment of the present invention.

As shown in FIG. 11, the substrate (not shown) that is subject to the predetermined plasma process in the plasma processing chamber 1 is floated and transferred, as being mounted on the tray 35, to the subject-to-be-processed discharging chamber 2 by the transfer function units 30, 30 in the subject-to-be-processed discharging chamber 2 and the control function unit.

By means of the control function unit, the arm portion 24*c* of the transfer arm 24 horizontally moves toward the downstream side in the transfer direction along the corresponding rail (not shown in FIG. 11), wherein the first inward projecting end 24*d* at the arm portion 24*c* moves from the outer side toward the inner side to be in contact with and engaged with the third cutout portion 35*d* of the tray 35 due to the inward movement of the guide portion 24*b*. FIG. 11 indicates the state before the first inward projecting ends 24*d* of the respective arm portions 24*c* are in contact with and engaged with the third cutout portion 35*d* at the tray 35.

The tray 35 is firstly moved toward the downstream side in the transfer direction along the rail by a first predetermined distance with the first inward projecting end 24*d* of the arm portion 24*c* being in contact with and engaged with the third cutout portion 35*d* at the tray 35.

Figure 12:
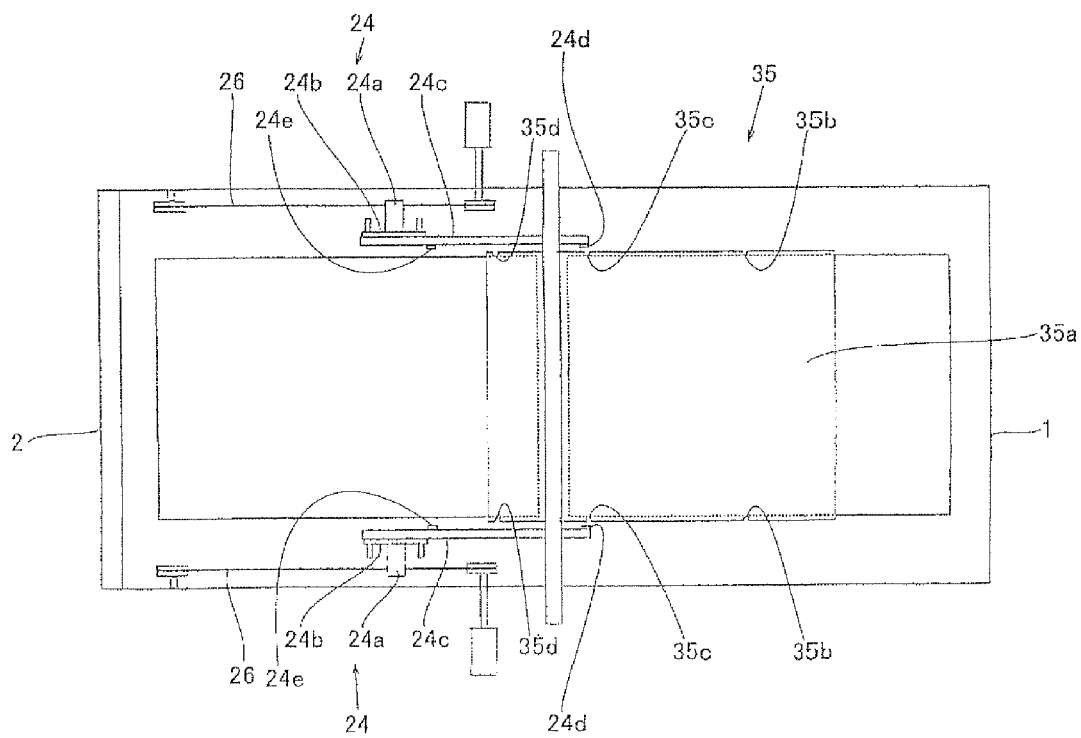
FIG. 12 is a plan view for explaining a procedure of a transfer by the substrate transfer apparatus according to a modification of the second embodiment of the present invention.

The procedure will next be described with reference to FIG. 12. The tray 35 that is moved by the first predetermined distance is stopped with a part thereof entering the subject-to-be-processed discharging chamber 2. Then, the first inward projecting end 24*d* at the arm portion 24*c* moves from the inner side toward the outer side by the outward movement of the guide portion 24*b*, thereby being disengaged from the third cutout portion 35*d* at the tray 35. Next, the arm portion 24*c* is returned toward the upstream side in the transfer direction by the first predetermined distance. In this case, the first inward projecting end 24*d* at the arm portion 24*c* is located at the position opposite to the second cutout portion 35*c* at the tray 35.

Thereafter, the tray 35 is moved toward the downstream side in the transfer direction by the second predetermined distance along the rail, in which the first inward projecting end 24d at the arm portion 24c moves from the outer side toward the inner side to be in contact with and engaged with the second cutout portion 35c at the tray 35.

Figure 13:
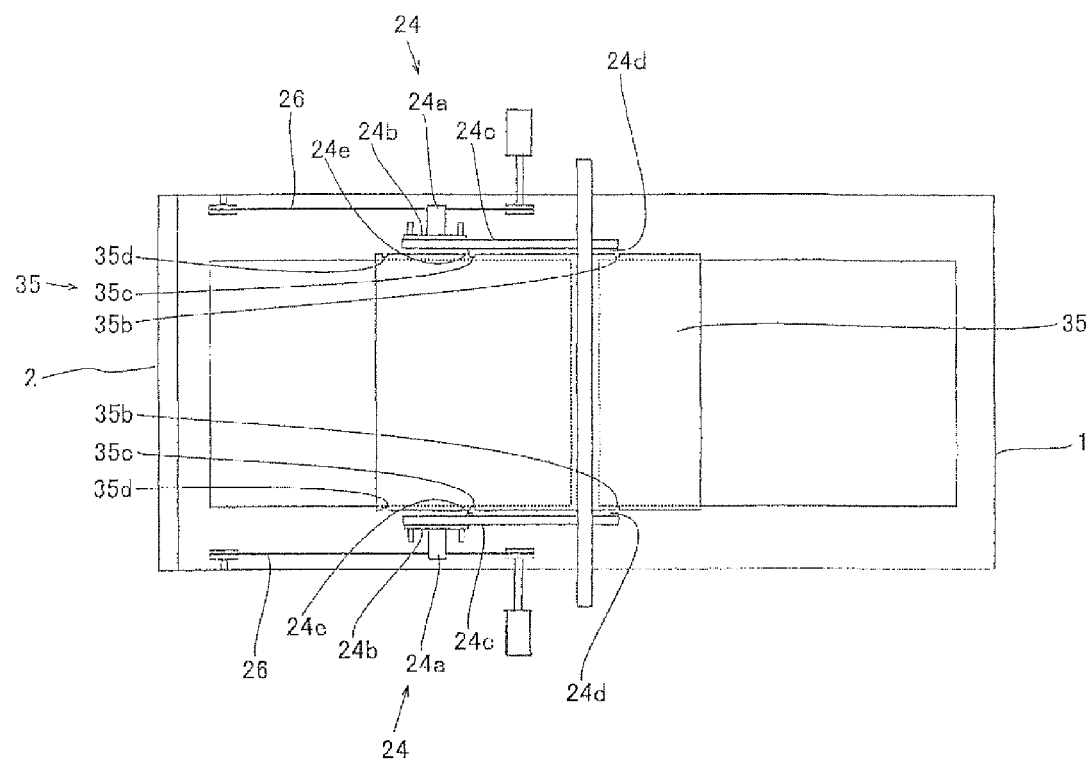
FIG. 13 is a plan view for explaining a procedure of a transfer by the substrate transfer apparatus according to a modification of the second embodiment of the present invention.

The procedure will next be described with reference to FIG. 13. The tray 35 that is moved by the second predetermined distance is stopped with a part thereof remaining in the plasma processing chamber 1. Then, the first inward projecting end 24d at the arm portion 24c moves from the inner side toward the outer side by the outward movement of the guide portion 24b, thereby being disengaged from the second cutout portion 35c at the tray 35. Next, the arm portion 24c is returned toward the upstream side in the transfer direction by the second predetermined distance. In this case, the first inward projecting end 24d at the arm portion 24c is located at the position opposite to the first cutout portion 35b at the tray 35, and the second inward projecting end 24e at the arm portion 24c is located at the position opposite to the second cutout portion 35c at the tray 35.

Thereafter, the tray 35 is moved toward the downstream side in the transfer direction by the third predetermined distance along the rail, in which the first inward projecting end 24d and the second inward projecting end 24e at the arm portion 24c move from the outer side toward the inner side to be respectively in contact with and engaged with the first cutout portion 35b and the second cutout portion 35c at the tray 35.

Figure 14:
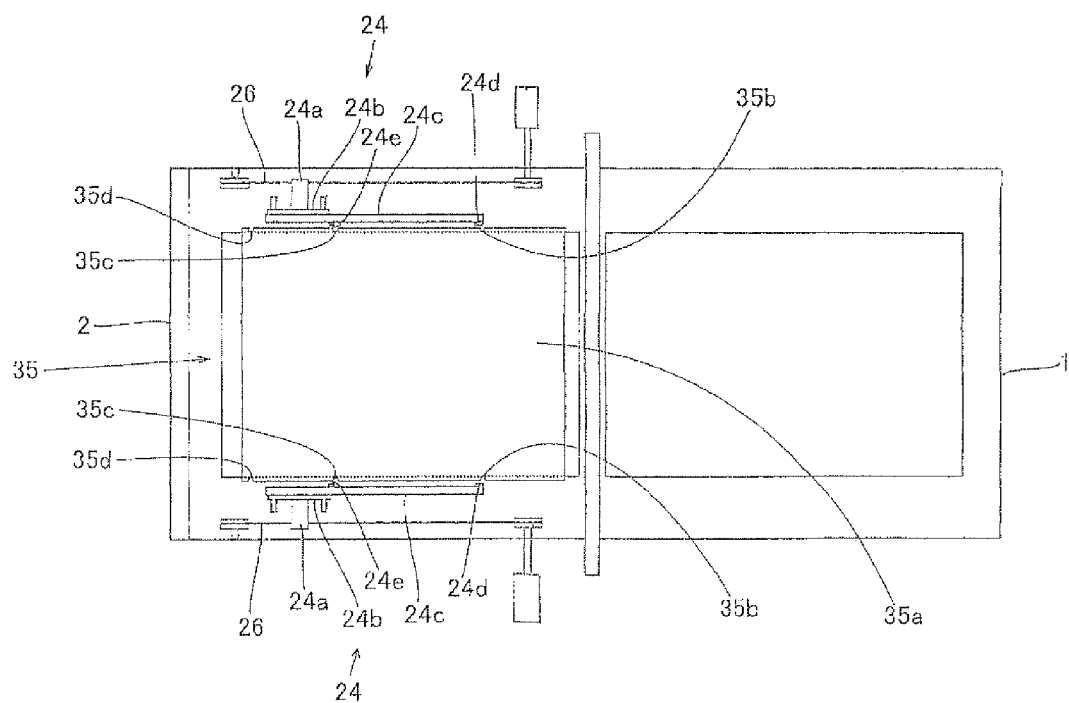
FIG. 14 is a plan view for explaining a procedure of a transfer by the substrate transfer apparatus according to a modification of the second embodiment of the present invention.

The procedure will next be described with reference to FIG. 14. The tray 35 that is moved by the third predetermined distance is stopped with the overall thereof entering the subject-to-be-processed discharging chamber 2. Then, the first inward projecting end 24d and the second inward projecting end 24e at the arm portion 24c move from the inner side toward the outer side by the outward movement of the guide portion 24b, thereby being disengaged from the first cutout portion 35b and the second cutout portion 35c at the tray 35 respectively.

Third Embodiment

Figure 15:
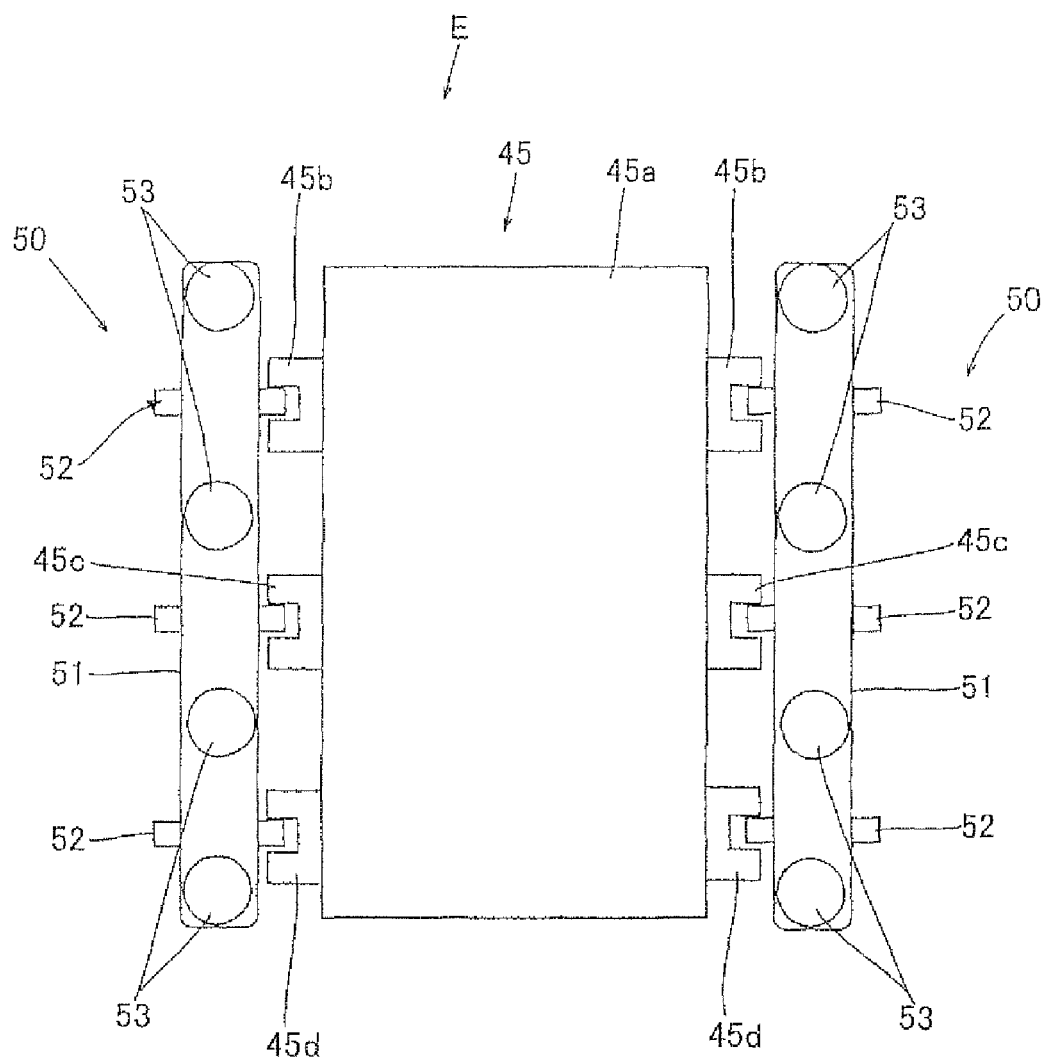
FIG. 15 is schematic plan view of a part of a substrate transfer apparatus that is incorporated in a plasma processing apparatus according to a third embodiment of the present invention.

FIG. 15 is a schematic plan view partly showing a substrate transfer apparatus E, which is incorporated in a plasma processing apparatus, according to a third embodiment of the present invention.

As shown in FIG. 15, the substrate transfer apparatus E according to the third embodiment of the present invention includes subject-to-be-processed carrying-in chamber, plasma processing chamber 1, and the subject-to-be-processed discharging chamber 2, those of which are the same as those in the substrate transfer apparatus D in the first embodiment.

The substrate transfer apparatus E further includes a tray 45 that is placed onto a guide plate for mounting a substrate to be transferred thereon and that is floated by a floating gas, and a transfer member 50 for transferring the floated tray 45 from the guide plate to the adjacent other guide plate.

Like the tray in the first embodiment, the tray 45 is also made of stainless steel, and a mirror finish is provided on the back surface thereof in order to realize a smooth transfer. The tray 45 has a main body 45a having both side edges, and three pairs of projecting portions 45b, 45b, 45c, 45c, 45d, and 45d, which are formed to partially project from both side edges of the main body 45a. The first to third projecting portions 45b, 45c, and 45d at one side edge of the tray 45 are equally spaced.

A pair of transfer members 50 and 50 is provided at the respective positions at both sides of the tray 45 placed onto the guide plate. Each of the transfer members 50 has an endless track belt 51 and protrusions 52, . . . 52.

The endless track belt 51 is rotatably provided around vertical rotational shafts 53, . . . 53. A plurality of protrusions 52, . . . 52 is equally spaced (with a space equal to that between the projecting portions 45b, 45c, and 45d of the tray 45) at the surface of the belt 51 so as to horizontally protrude from the surface of the belt 51. The plurality of protrusions 52, . . . 52 are in contact with and engaged with or disengaged from the projecting portions 45b, . . . 45d of the tray 45 with the rotation of the belt 51.

Each of the projecting portions 45b, . . . 45d of the tray 45 has an engagement cutout portion having a rectangular planar shape. On the other hand, the planar shape of each of the protrusions 52, . . . 52 of the transfer member 50 is formed into a square that is an engagement shape corresponding to the cutout portions of the projecting portions 45b, . . . 45d at the tray 45.

Although not shown, a pair of the transfer members 50 and 50 is provided for each guide plate in the respective three vacuum chambers (subject-to-be-processed carrying-in chamber, plasma processing chamber, and subject-to-be-processed discharging chamber).

The other configurations of the substrate transfer apparatus 1E according to the third embodiment of the present invention are substantially the same as those of the substrate transfer apparatus D according to the first embodiment.

According to the substrate transfer apparatus E according to the third embodiment, the plurality of protrusions 52, . . . 52 at the endless track belt 51 at each of the transfer members 50 are in contact with and engaged with the three pairs of the projecting portions 45b, . . . 45d of the tray 45 with the rotation of the belt 51. Therefore, the tray can be transferred as floated with the plurality of protrusions at the respective belts being engaged with the plurality of the projecting portions at the tray without the need of the engagement between the fitting holes of the tray and the leading end portion of the transfer arm as in the conventional substrate transfer apparatus. Consequently, the possibility of the trouble related to the transfer as in the conventional case can be prevented.

According to the substrate transfer apparatus E, a pair of transfer members 50 and 50 is provided for each guide plate in three vacuum chambers. Therefore, the floated tray can more smoothly be transferred from the guide plate of one vacuum chamber to the other guide plate in the adjacent vacuum chamber, whereby the trouble related to the transfer can more be prevented.

What is claimed is:
1. A substrate transfer apparatus comprising:
a plurality of floating-transfer guide plates adjacent to each other with a space there between, each of guide plates having a plurality of floating gas ejecting holes;
a gas supplying source for supplying a floating gas to the guide plates;
a tray that is placed on one of the guide plates in order to mount a substrate to be transferred, and that is floated by the floating gas; and
a transfer arm for transferring the floated tray from one of the plurality of guide plates to the adjacent guide plate downstream in a transfer direction, wherein
the tray includes both side edges parallel to the transfer direction of the substrate, and a contact/engagement portion formed at the respective both side edges for the transfer arm, and the transfer arm is provided as a pair so as to be located at the respective side edges of the tray placed onto the guide plate, each of the transfer arms including a base portion that can horizontally reciprocate along a rail provided parallel to the transfer direction, a guide portion provided to the base portion, that can horizontally reciprocate in a direction orthogonal to the transfer direction, and an arm portion provided to the guide portion, that can horizontally reciprocate in the direction parallel to the transfer direction, and that has an inward projecting end, which is a free end, wherein the inward projecting end of the transfer arm contacts and engages, from an outer side to an inner side of the transfer arm, with the contact/engagement portion at the side edge of the tray, or disengaged therefrom from the inner side to the outer side, due to the horizontal reciprocating movement of the guide portion.

2. The substrate transfer apparatus according to claim 1, wherein
each of the contact/engagement portions at the tray is a cutout portion that is formed into a recessed shape at each of the both side edges of the tray, wherein the inward projecting end at the arm portion of each of the transfer arms is in contact with and engaged with or disengaged from the cutout portion.

3. The substrate transfer apparatus according to claim 1, wherein
each of the contact/engagement portions at the tray is a projecting portion that is formed so as to partially project outwardly from each of the both side edges of the tray, wherein the inward projecting end at the arm portion of each of the transfer arms is in contact with and engaged with or disengaged from the projecting portion.

4. The substrate transfer apparatus according to claim 3, wherein
the projecting portion at the tray has a cutout portion having a specific shape, with which the inward projecting end at the arm portion of each of the transfer arms is in contact and engaged or from which the same is disengaged.

5. The substrate transfer apparatus according to claim 4, wherein
the transfer arm is configured such that the inward projecting end at the arm portion is formed to have an engagement shape corresponding to the cutout portion of the projecting portion at the tray.

6. The substrate transfer apparatus according to claim 1, wherein
the respective both side edges of the tray are configured such that the arm portions of the respective transfer arms are in contact therewith at a plurality of portions.

7. The substrate transfer apparatus according to claim 6, wherein
the contact/engagement portion at the tray is formed at a plurality of portions of the both side edges of the tray, wherein a plurality of inward projecting ends at the arm portions of the respective transfer arms are provided so as to correspond to the contact/engagement portions of the tray.

8. The substrate transfer apparatus according to claim 1, wherein
the transfer arm is configured such that the inward projecting end at the arm portion can receive the contact/engagement portion at the tray as vertically holding the same.

9. A substrate transfer method by using a substrate transfer apparatus comprising: a plurality of floating-transfer guide plates adjacent to each other with a space there between, each of guide plates having a plurality of floating gas ejecting holes; a gas supplying source for supplying a floating gas to the guide plates; a tray that is placed on one of the guide plates in order to mount a substrate to be transferred, and that is floated by the floating gas; and a transfer arm for transferring the floated tray from one of the plurality of guide plates to the adjacent guide plate downstream in a transfer direction, wherein the tray includes both side edges parallel to the transfer direction of the substrate, and a contact/engagement portion formed at the respective both side edges for the transfer arm, and the transfer arm is provided as a pair so as to be located at the respective side edges of the tray placed onto the guide plate, each of the transfer arms including a base portion that can horizontally reciprocate along a rail provided parallel to the transfer direction, a guide portion provided to the base portion, that can horizontally reciprocate in a direction orthogonal to the transfer direction, and an arm portion provided to the guide portion, that can horizontally reciprocate in the direction parallel to the transfer direction, and that has an inward projecting end, which is a free end, wherein the inward projecting end of the transfer arm contacts and engages, from an outer side to an inner side of the transfer arm, with the contact/engagement portion at the side edge of the tray, or disengaged therefrom from the inner side to an outer side, due to the horizontal reciprocating movement of the guide portion, wherein
the tray is transferred in a state in which the inward projecting ends at the arm portions of a pair of the transfer arms are in contact with and engaged with the contact/engagement portion at the tray so as to hold same.

* * * * *

UNITED STATES PATENT AND TRADEMARK OFFICE
CERTIFICATE OF CORRECTION

PATENT NO. : 8,137,046 B2  
APPLICATION NO. : 12/536912  
DATED : March 20, 2012  
INVENTOR(S) : Kishimoto et al.

Page 1 of 1

It is certified that error appears in the above-identified patent and that said Letters Patent is hereby corrected as shown below:

On the Title Page, (under Item (65) Prior Publication Data) insert Item --(30) Foreign Application Priority Data Aug. 7, 2008 (JP) 2008-204210--

Signed and Sealed this  
Sixteenth Day of October, 2012

David J. Kappos  
*Director of the United States Patent and Trademark Office*